(12) United States Patent
Kawai et al.

(10) Patent No.: US 8,053,176 B2
(45) Date of Patent: Nov. 8, 2011

(54) PATTERNING METHOD OF ORGANIC ELECTROLUMINESCENT DEVICE

(75) Inventors: Takashi Kawai, Yonezawa (JP); Atsushi Oda, Yonezawa (JP)

(73) Assignee: Yamagata Promotional Organization for Industrial Technology, Yamagata-shi, Yamagata (JP)

( * ) Notice: Subject to any disclaimer, the term of this patent is extended or adjusted under 35 U.S.C. 154(b) by 1013 days.

(21) Appl. No.: 11/947,121

(22) Filed: Nov. 29, 2007

(65) Prior Publication Data

US 2008/0131816 A1    Jun. 5, 2008

(30) Foreign Application Priority Data

Nov. 29, 2006    (JP) .................. 2006-320982

(51) Int. Cl.
    *H05B 33/10*    (2006.01)
    *H01J 9/227*    (2006.01)
(52) U.S. Cl. ................... 430/319; 430/321; 445/24
(58) Field of Classification Search ............... None
    See application file for complete search history.

(56) References Cited

U.S. PATENT DOCUMENTS

| 6,037,190 A | 3/2000 | Chao et al. |
| 2004/0077250 A1 | 4/2004 | Miyadera et al. |

FOREIGN PATENT DOCUMENTS

| JP | 4-255692 A | 9/1992 |
| JP | 9-306669 A | 11/1997 |
| JP | 2793373 B2 | 6/1998 |
| JP | 2001-167881 A * | 6/2001 |
| JP | 2003115387 A | 4/2003 |
| WO | WO 02/07235 A1 * | 1/2002 |

OTHER PUBLICATIONS

Computer-generated translation of JP 2001-167881 (Jun. 2001).*
Computer-generated translation of JP 9-306669 (Nov. 1997).*
Computer-generated translation of JP 2003-115387 (Apr. 2003).*
European Search Report date Apr. 1, 2010, issued in corresponding European Patent Application No. 07023130.3.

* cited by examiner

*Primary Examiner* — John A. McPherson
(74) *Attorney, Agent, or Firm* — Westerman, Hattori, Daniels & Adrian, LLP

(57) ABSTRACT

The present invention provides a patterning method of an organic EL device that can easily and efficiently be performed with high definition, and that can control a contrast by a luminous brightness.
In an organic EL device having an organic layer, including an organic luminescent material, formed between a pair of counter electrodes, ultraviolet ray is irradiated to the organic layer, and the amount of irradiation is changed to form an emission pattern having a contrast caused by a luminous brightness corresponding to the amount of the irradiation of the ultraviolet ray.

3 Claims, 1 Drawing Sheet

PATTERNING METHOD OF ORGANIC ELECTROLUMINESCENT DEVICE

BACKGROUND OF THE INVENTION

1. Field of the Invention

The present invention relates to a patterning method of an organic electroluminescent (hereinafter referred to as organic EL) device in which ultraviolet ray is irradiated to an organic EL device to form a light-emission pattern.

2. Description of the Related Art

An organic EL device is a self-emitting type device employing an organic compound as a luminescent material. It can emit light with high speed, so that it is suitable for a display of a moving image. Further, an organic EL device has a characteristic that its device structure is simple, which makes it possible to reduce a size of a display panel. Since the organic EL device has such an excellent characteristic, it has been spreading in daily life for use in a cellular phone, or a vehicle-mounted display.

There has conventionally been a method of coloring a cathode layer with the use of a mask, or a method of insulation using a resist, as a method for patterning the organic EL device.

However, these methods entail problems as follows. Specifically, a pattern blurring of a cathode occurs due to the deviation of the mask, or the like. Further, appropriate solvent corresponding to the organic luminescent material should be selected, since the method includes a wet-type photolithography process.

The term "pattern" here indicates an icon, character, letter, illustration, graphic, design, or the like displayed on a device panel, and the term "patterning" means providing the function for displaying these patterns.

In the conventional patterning method, it is difficult to cope with high definition of the pattern. Therefore, various studies have been made for amore efficient patterning method. For example, Japanese Patent No. 2793373 proposes, as one method of efficiently patterning with high definition, a patterning method in which ultraviolet ray is irradiated to an organic EL device and the irradiated area is made a non-emission area.

In the patterning method disclosed in Japanese Patent No. 2793373, ultraviolet ray is irradiated to an organic EL device before or after an electrode is formed. When ultraviolet ray is irradiated after a panel is formed, transmittance of the ultraviolet ray at a transparent substrate and a transparent electrode is insufficient, so that sufficient effect of the irradiation of ultraviolet ray cannot be obtained. Therefore, it is difficult to efficiently perform patterning with high definition.

In this patterning method, the area of the EL device where ultraviolet ray is irradiated is made a non-emission area, resulting in that the contrast in the emission area cannot be controlled.

SUMMARY OF THE INVENTION

The present invention is accomplished in order to solve the foregoing technical problems, and its object is to provide a patterning method of an organic EL device by irradiation of ultraviolet ray, that can easily and efficiently be performed with high definition, and that can control a contrast by a luminous brightness.

A patterning method of an organic EL device of the present invention is characterized in that, in an organic EL device having an organic layer, including an organic luminescent material, formed between a pair of counter electrodes, ultraviolet ray is irradiated to the organic layer, and the amount of irradiation is changed to form a emission pattern having a contrast caused by a luminous brightness corresponding to the amount of the irradiation of the ultraviolet ray.

According to the method described above, the contrast by the luminous brightness is provided to the emission pattern, whereby an organic EL panel having excellent design property can easily be manufactured.

In the patterning method of the organic EL device described above, ultraviolet ray may be irradiated to the organic layer before the counter electrodes are formed. Alternatively, at least one of the counter electrodes may be a transparent electrode, and ultraviolet ray may be irradiated from the side of the transparent electrode of the organic EL device.

In the patterning method of the organic EL device described above, ultraviolet ray is preferably irradiated while applying a bias between the counter electrodes.

Accordingly, it is possible to accelerate the speed of reducing brightness during the patterning carried out by irradiating ultraviolet ray, whereby the patterning can efficiently and simply be performed.

It is preferable that the organic layer contains a polynuclear phenanthroline derivative expressed by a general formula (I):

$$Z(Y)_n \qquad (I)$$

[wherein Z is a bivalent or trivalent group selected from the group consisting of a bivalent or trivalent aromatic hydrocarbon group and a bivalent or trivalent heterocyclic group; and Y is a phenanthroline group expressed by

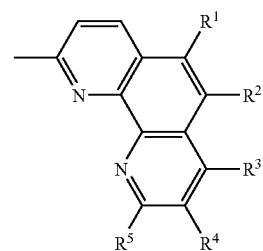

[Chemical 1]

wherein n is 2 or 3, $R^1$ to $R^5$ are groups independently selected from the group consisting of hydrogen, alkyl group, alkoxy group, aryl group (which may be substituted with alkyl group), aryloxy group, aralkyl group (aryl group may be substituted with an alkyl group), alkylamino group, arylamino group, RCOO— (R is selected from the groups consisting of an alkyl group, aryl group, and aralkyl group), carboxyl group, amino group, trifluoromethyl group, nitro group, halogen, cyano group, and XA (X is an atom selected from the group consisting of O, S, Se and Te, and A is an alkyl group or aryl group)].

The patterning by the irradiation of the ultraviolet ray can efficiently be performed by forming the organic layer with the addition of the polynuclear phenanthroline derivative described above.

In particular, the polynuclear phenanthroline derivative expressed by the formula (I) is preferably a compound (1,4-di(1,10-phenanthroline-2-yl)benzene (hereinafter referred to as DPB) expressed by

[Chemical 2]

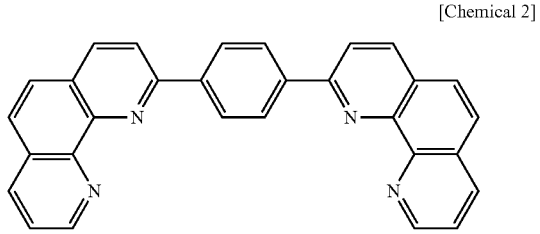

As described above, the patterning method of the organic EL device of the present invention does not need the preparation and setting of the deposition mask for the patterning conventionally used, and the photolithography process, whereby the patterning of the organic EL device having a contrast can easily be performed by using ultraviolet ray.

According to the present invention, an optional patterning can be performed even after an organic EL device is formed into a panel; thus, it is efficient. Also, the productivity of an organic EL panel can be enhanced.

Further, the present invention makes it possible to manufacture an organic EL panel illumination or the like having excellent design property in which a pattern having a contrast appears only upon the light emission.

DESCRIPTION OF THE PREFERRED EMBODIMENTS

Figure 1:
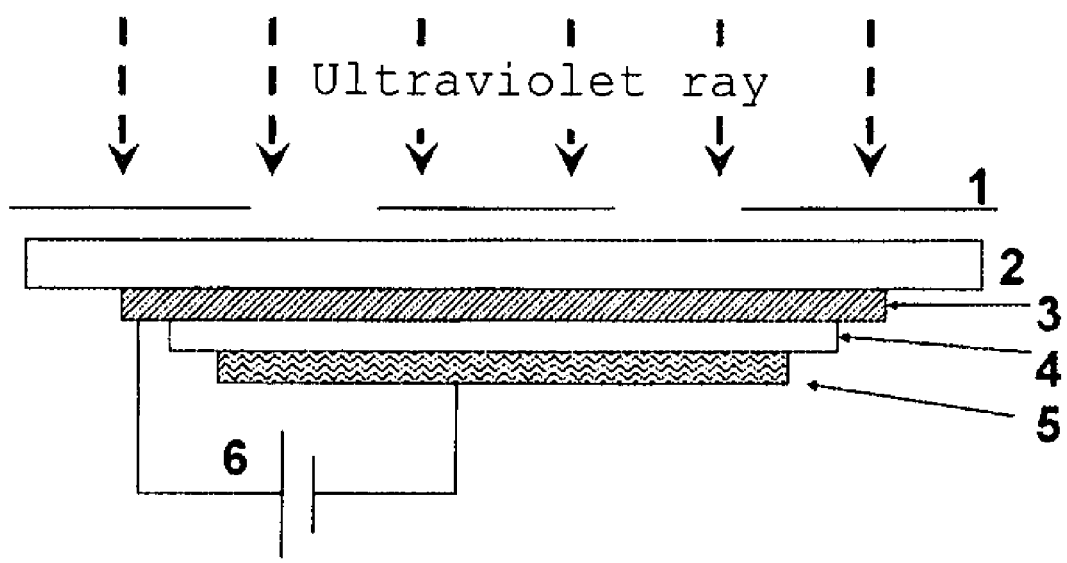
FIG. 1 is a schematic sectional view showing one example of a patterning method of an organic EL device of the present invention.

The present invention will be explained below in detail.

The patterning method of an organic EL device of the present invention is a method of patterning an organic EL device, which has an organic layer containing an organic luminescent material formed between a pair of counter electrodes, with the irradiation of ultraviolet ray, wherein the amount of the irradiation of ultraviolet ray to the organic layer is changed to form an emission pattern having a contrast.

According to the patterning method of the present invention, an optional patterning having a contrast can be performed not only before the electrodes of the organic EL device are formed but also after an organic EL panel is formed, whereby an organic EL panel illumination or the like having excellent design property can efficiently be manufactured.

The ultraviolet ray for the patterning may be irradiated to the organic layer before the counter electrodes are formed as described above. Alternatively, a transparent electrode is used as at least one of the counter electrodes, and the ultraviolet ray may be irradiated from the side of the transparent electrode. The ultraviolet ray can also be irradiated simultaneously when sealing the organic layer with a photocuring adhesive.

When the ultraviolet ray is irradiated before the counter electrodes are formed, the ultraviolet ray is irradiated to the organic layer without transmitting through the electrodes or substrate, so that the effect of the irradiation can be increased.

On the other hand, when the ultraviolet ray is irradiated after the organic EL device is formed into a panel, the patterning process becomes much easier since the handling becomes easy.

FIG. 1 is a conceptual view showing one example of the patterning method of an organic EL device of the present invention. FIG. 1 shows the method in which the patterning is performed after the organic EL device is formed.

The organic EL device shown in FIG. 1 has a transparent electrode (anode) 3, an organic layer 4 containing an organic luminescent material, and cathode 5 that are successively laminated on a transparent substrate 2, wherein the electrodes 3 and 5 are wired.

In the organic EL device, the side of the transparent substrate 2 is an emission surface. An ultraviolet shading mask 1 having a slit processed into a predetermined pattern shape is placed onto the transparent substrate 2, and ultraviolet ray is irradiated from above the mask 1.

Examples of a light source of the irradiated ultraviolet ray include high-pressure mercury lamp, low-pressure mercury lamp, hydrogen (heavy hydrogen) lamp, rare gas (xenon, argon, helium, neon, etc.) discharge lamp, nitrogen laser, excimer laser (e.g., XeCl, XeF, KrF, KrCl, etc.), hydrogen laser, halogen laser, various harmonics of visible-infrared laser (e.g., THG (Third Harmonic Generation) ray of YAG laser), etc.

It is preferable that the wavelength of the ultraviolet ray is within the range of 400 to 10 nm.

When the organic EL device to which the ultraviolet ray is irradiated is caused to emit light, the luminous brightness at the area not covered by the mask 1 and exposed to the irradiation of the ultraviolet ray is reduced.

By changing the amount of the irradiation by adjusting the light intensity or irradiation time in the irradiation of the ultraviolet ray, the luminous brightness of the organic EL device also changes according to the amount of the irradiation of the ultraviolet ray. The more the amount of the irradiation of the ultraviolet ray is, the more the luminous brightness is reduced, while the less the amount of the irradiation of the ultraviolet ray is, the less the reduction ratio of the luminous brightness is. When the amount of the irradiation of the ultraviolet ray is 0, i.e., when the ultraviolet ray is not irradiated, the luminous brightness becomes the largest.

By changing the amount of the irradiation of the ultraviolet ray, the emission pattern having a contrast caused by the luminous brightness can be formed as described above.

The amount of the irradiation of the ultraviolet ray can also be adjusted by adjusting the shading rate of the ultraviolet ray of the mask.

An optional patterning can be performed by the irradiation of the ultraviolet in which the spot irradiation with the use of a laser processing device, stepper, or the like is performed and the device is moved on the plane, or the irradiation of the ultraviolet ray in which the ultraviolet spot is moved. In this case, the amount of the irradiation of the ultraviolet ray can be changed by adjusting the light intensity or irradiation time of the ultraviolet spot, whereby an emission pattern having a contrast can be formed by the luminous brightness.

Since the patterning can be carried out by the irradiation of the ultraviolet ray of the present invention as described above, the preparation and setting of a deposition mask, which are conventionally necessary for the patterning, or the photolighography process is unnecessary, whereby the patterning can easily be performed.

At the area where the ultraviolet ray is irradiated, the luminous brightness of the organic EL device, patterned by the method of the present invention as described above is reduced with the increase of the integrated light quantity by the irradiation of the ultraviolet ray. Specifically, contrast of the luminous brightness can be provided, and the contrast can be changed according to the increase or decrease of the driving current of the device. The voltage of the device is increased with the reduction in the brightness. The brightness-voltage characteristic is stable showing no change over time.

Therefore, by using the above-mentioned phenomenon, the patterning having a contrast can be formed only at the time of the light emission. The organic EL device thus patterned is suitable for the use of the illumination utilizing the surface light emission characteristic.

The patterning method of the present invention described above is also suitable for a multiphoton device having a structure in which the light-emitting units of the organic EL device are serially connected in a circuit and these light-emitting units simultaneously emit light.

In the patterning method described above, examples of the organic layer that can be patterned by the irradiation of the ultraviolet ray include the one having a polynuclear phenanthroline derivative expressed by the formula (I), such as DBP, as a charge transporting material.

The organic layer having the polynuclear phenanthroline derivative added thereto is preferable, since the deformation such as irregularities by the irradiation of the ultraviolet ray is not produced, and the effect of reducing the brightness by the irradiation of the ultraviolet ray is significant even if strong ultraviolet laser is not used, so that the patterning can efficiently be performed.

The specific chemical formula of the polynuclear phenanthroline derivative are as follows.

[Chemical 3]

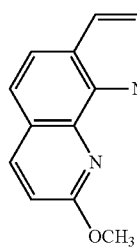

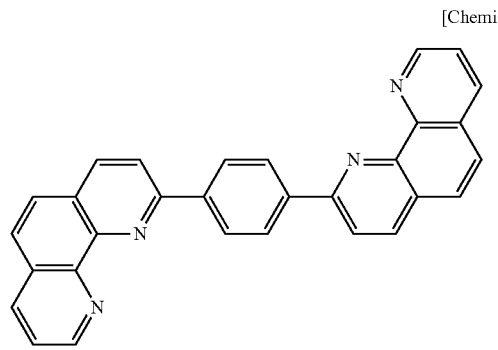

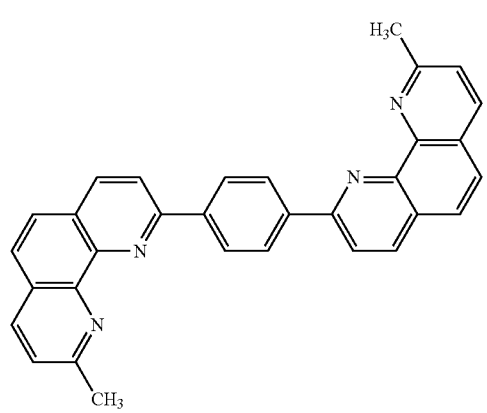

-continued

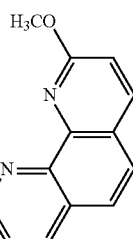

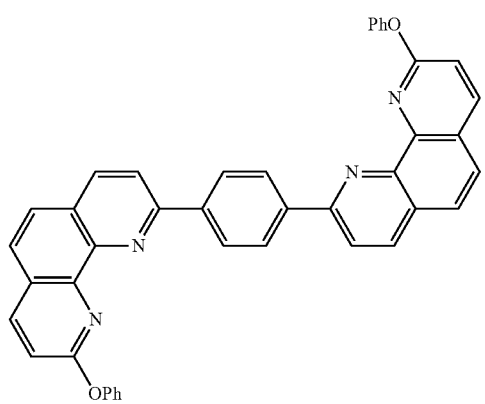

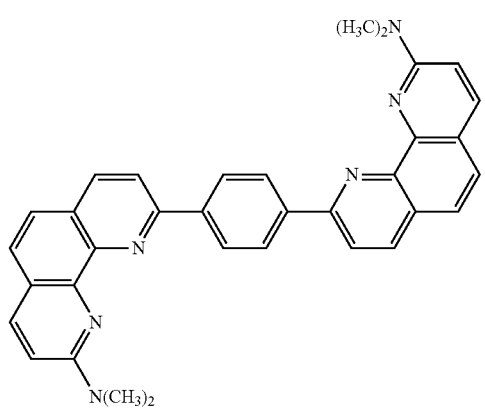

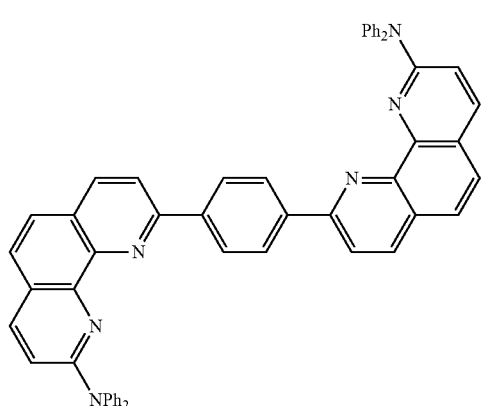

[Chemical 4]
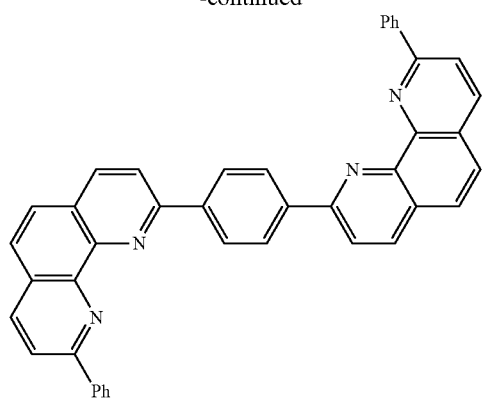
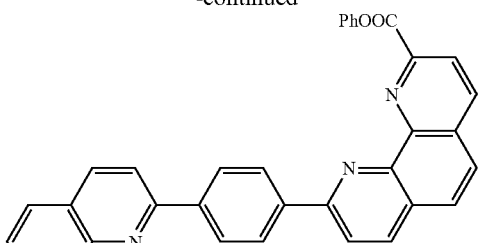
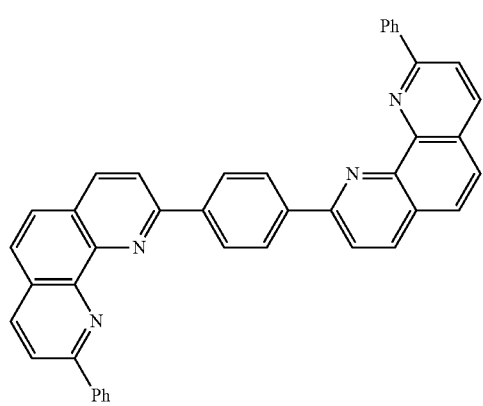
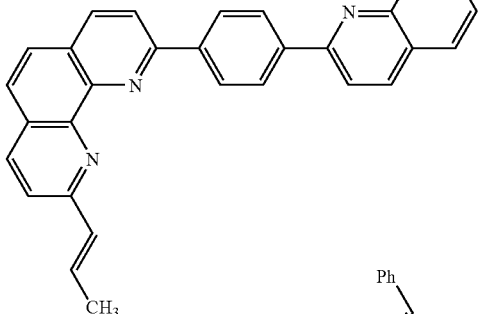
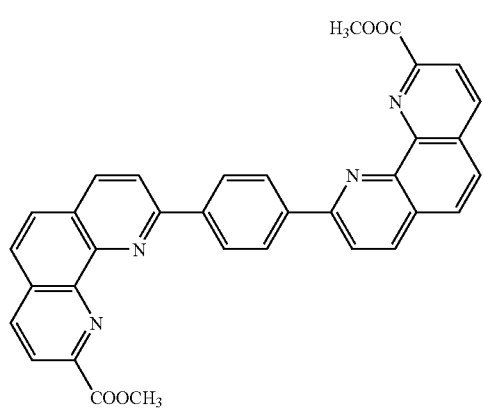
[Chemical 5]

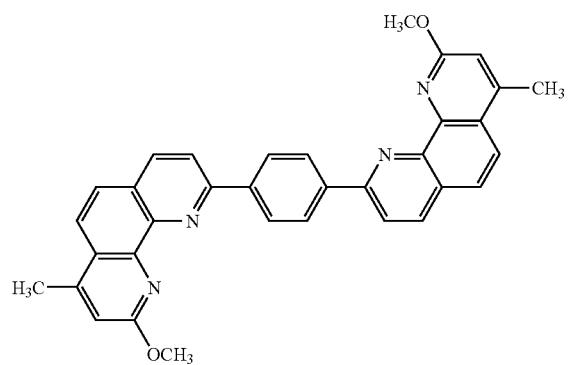
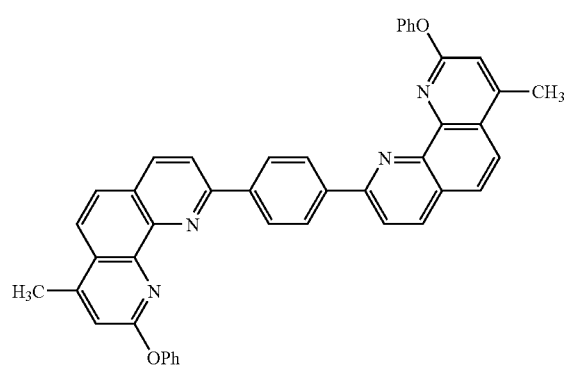
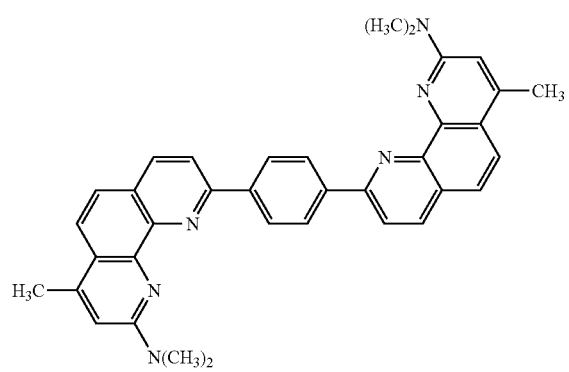
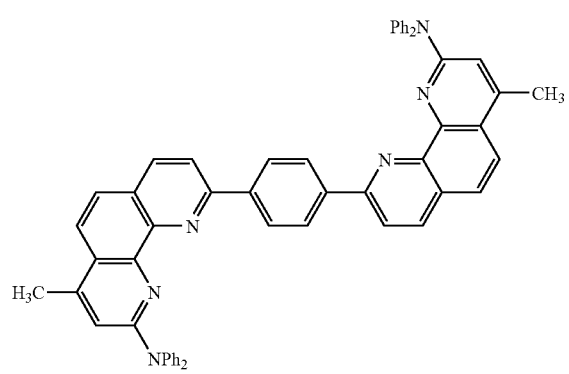
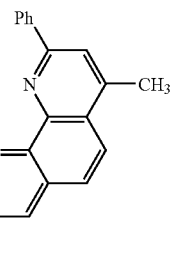
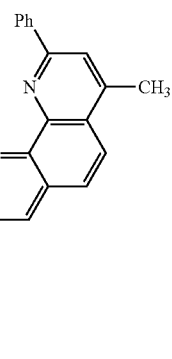
[Chemical 6]
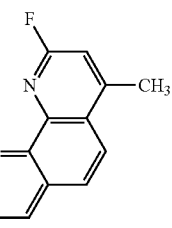
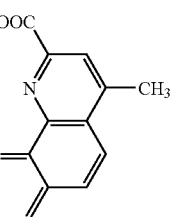

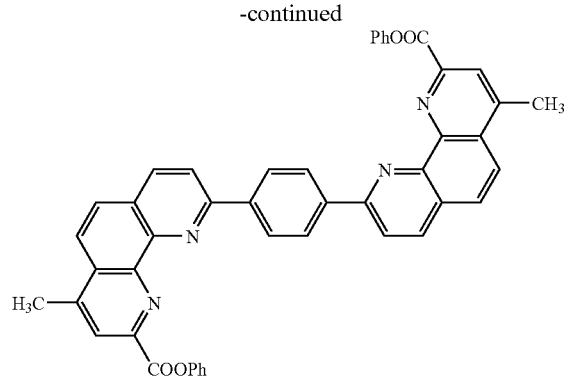
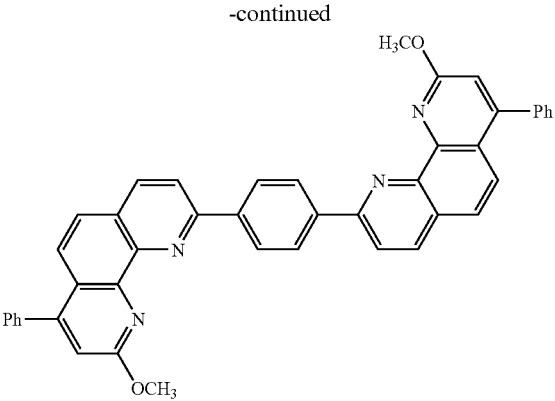
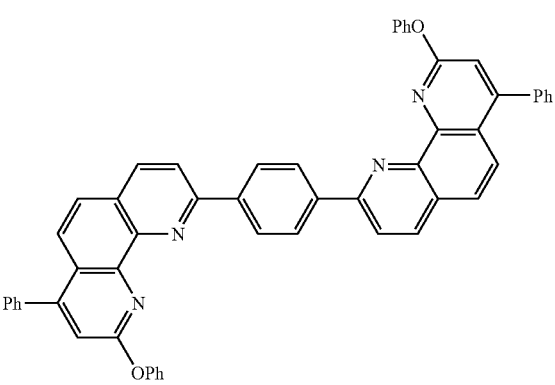
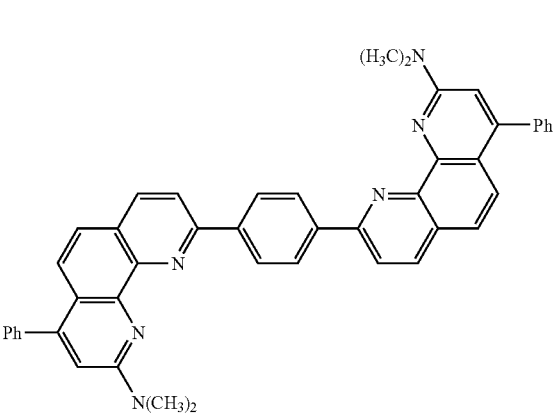
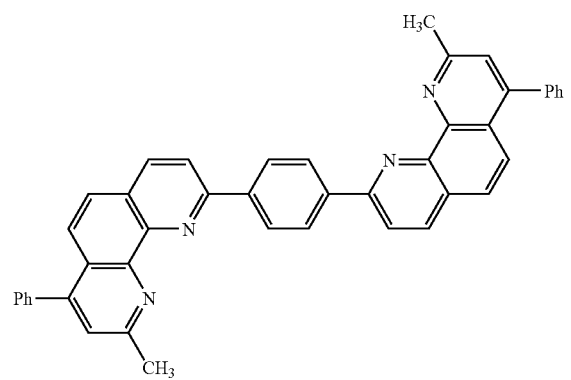

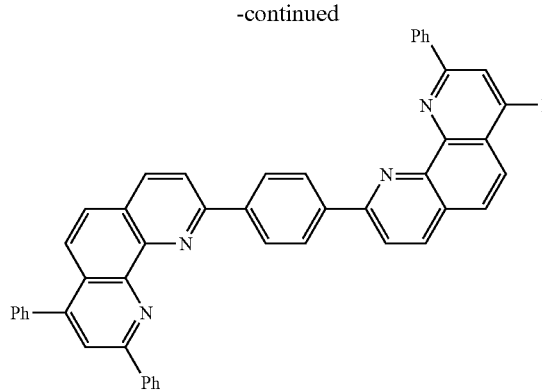
[Chemical 8]
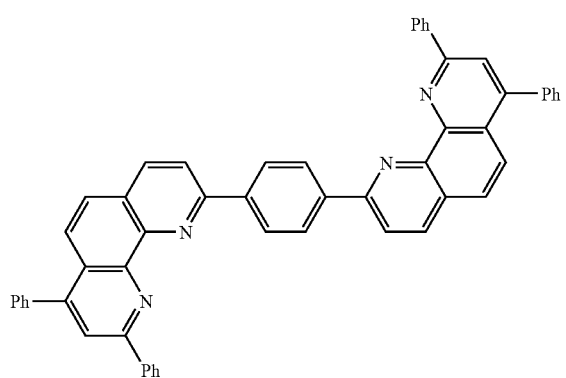
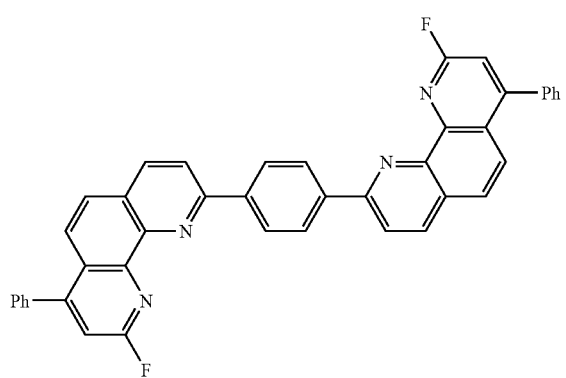
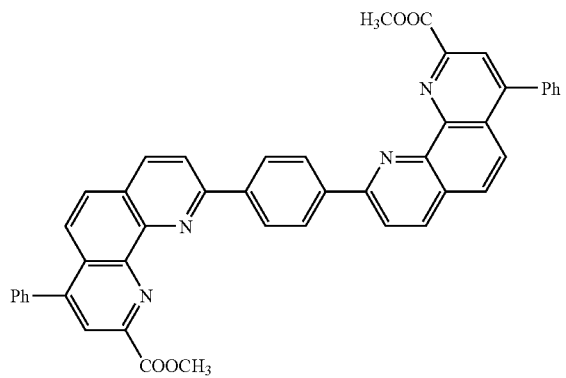
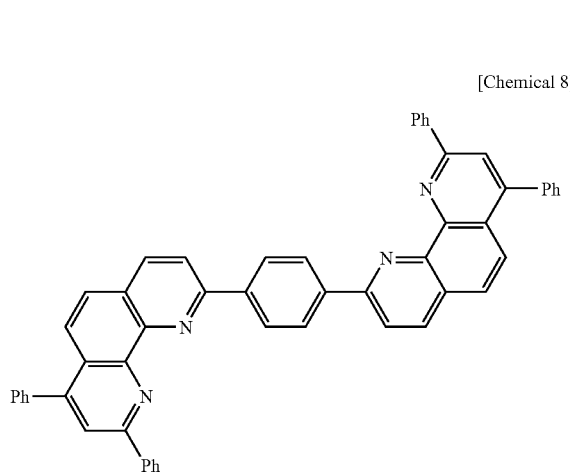
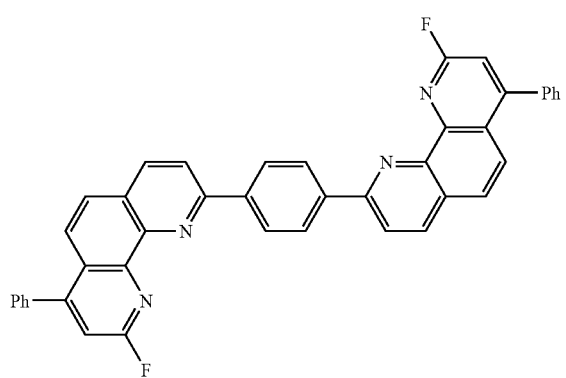
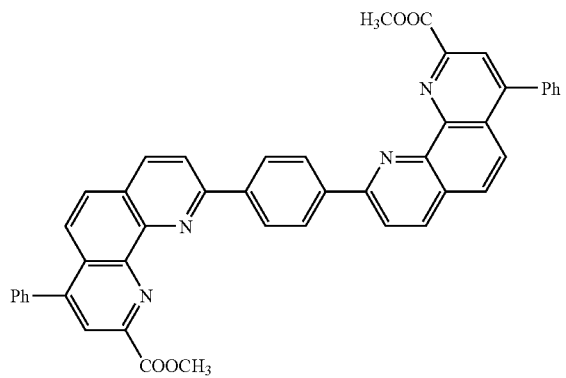
[Chemical 9]
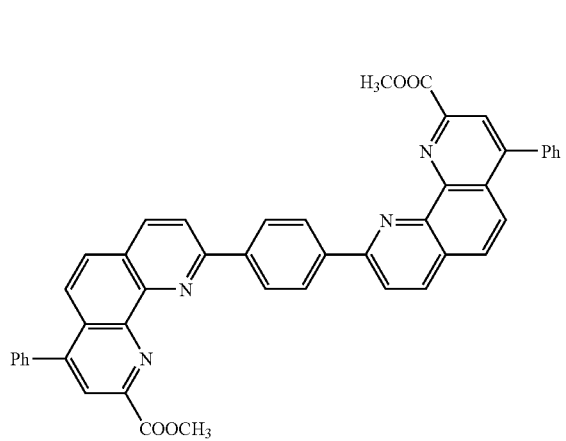

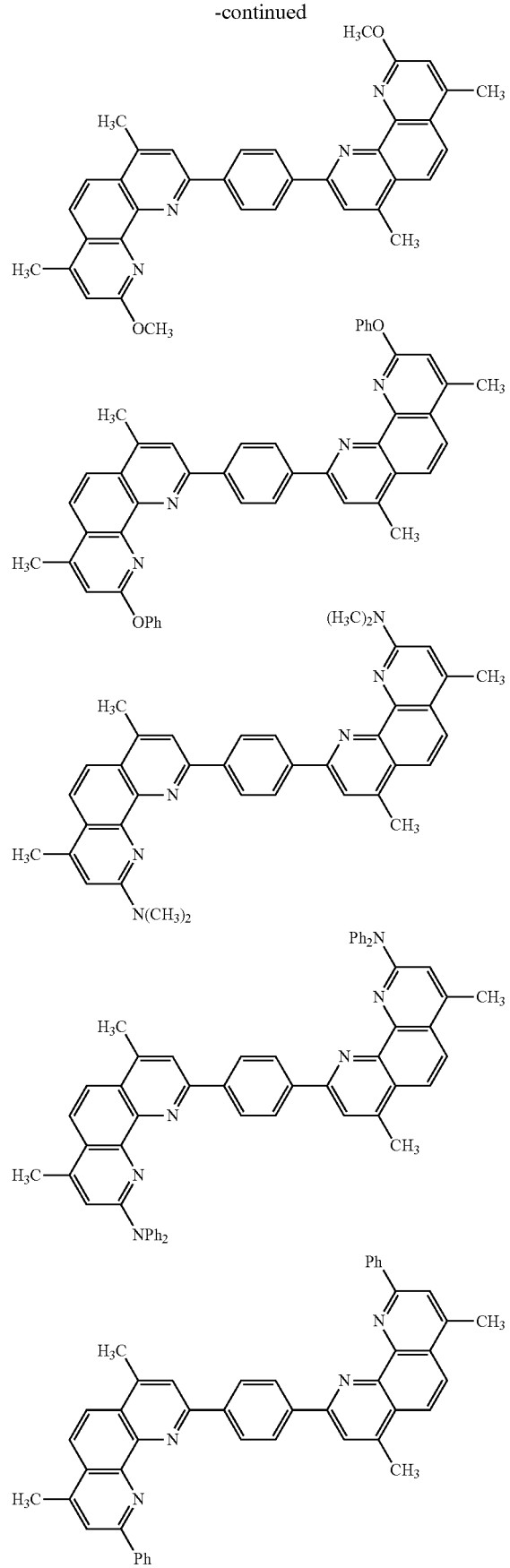
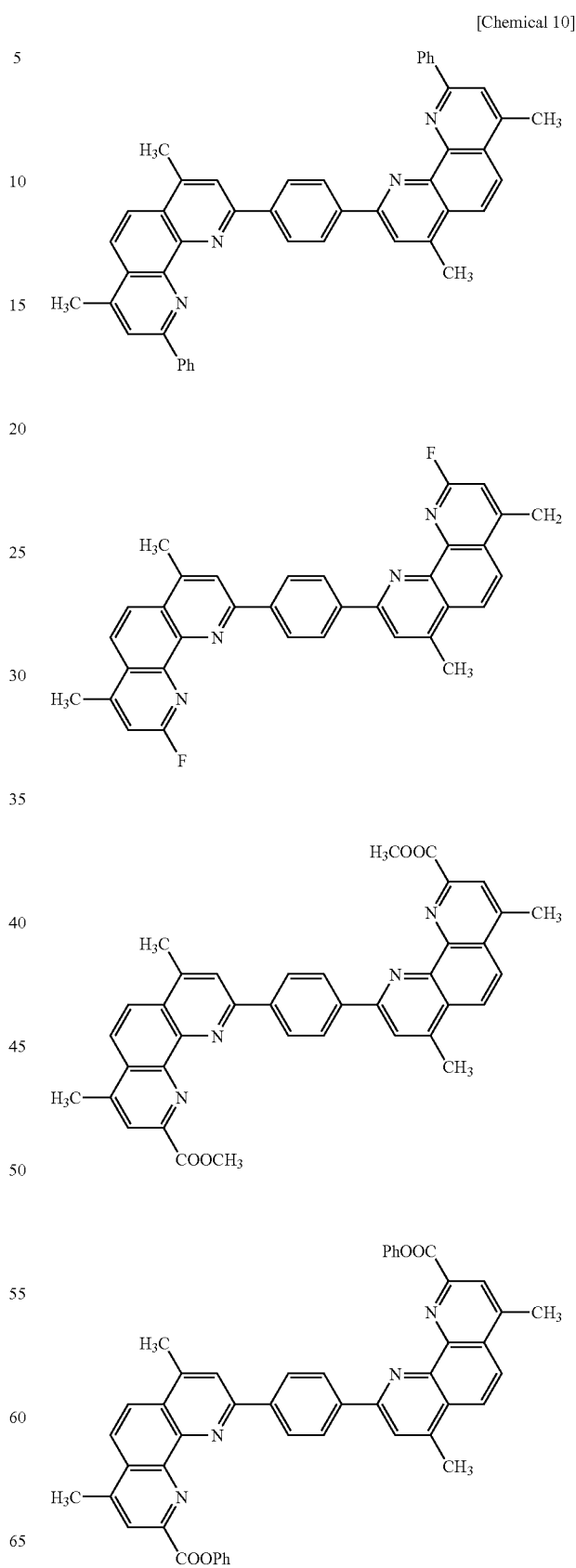

-continued
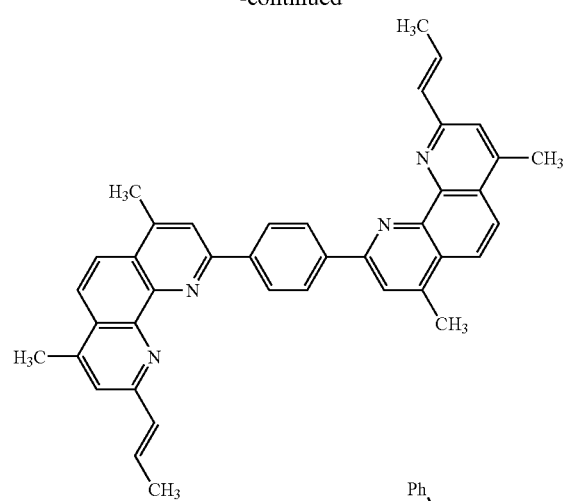
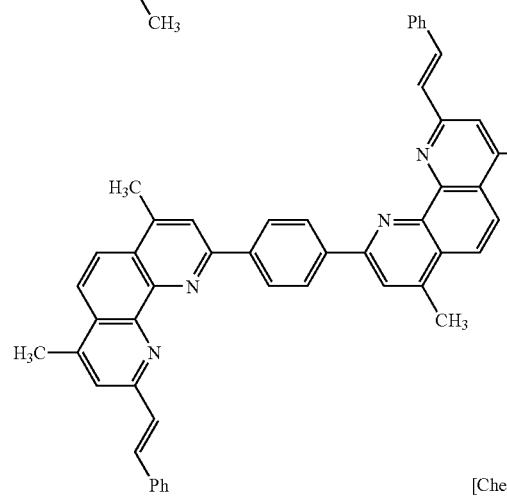
[Chemical 11]
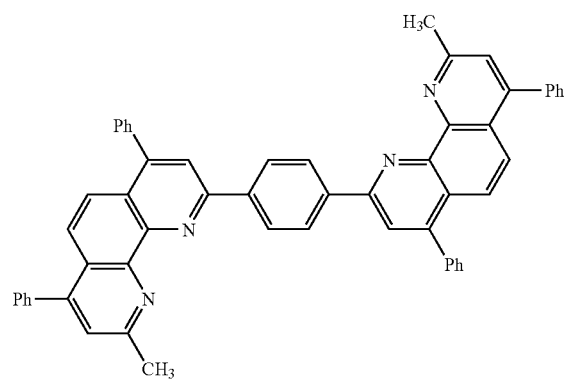
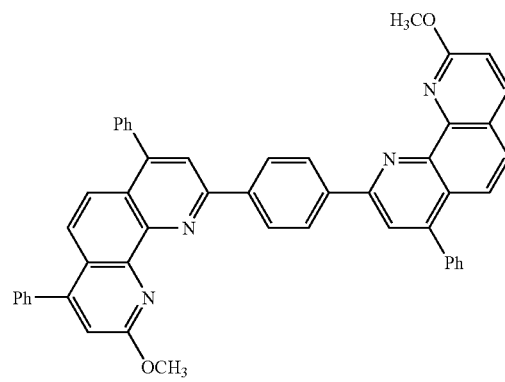
-continued
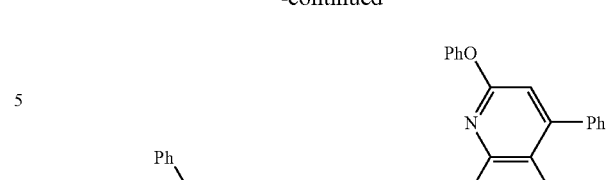
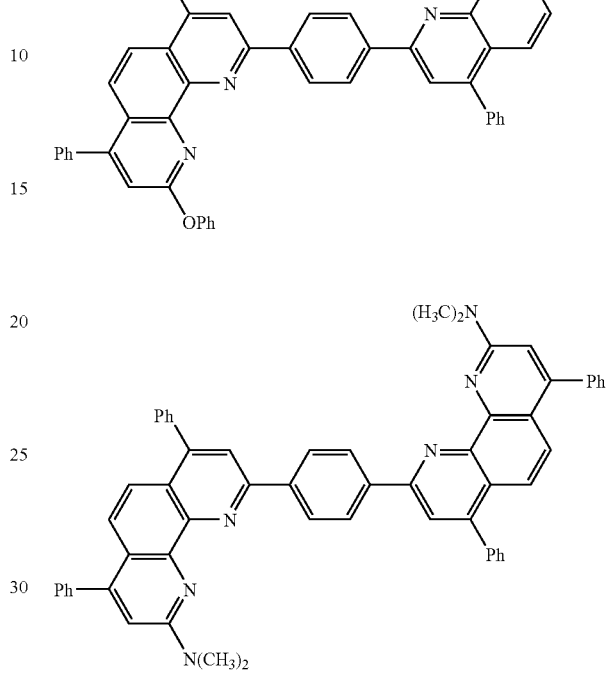
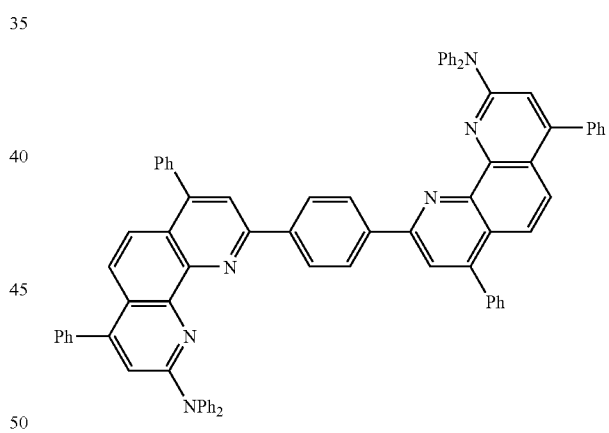
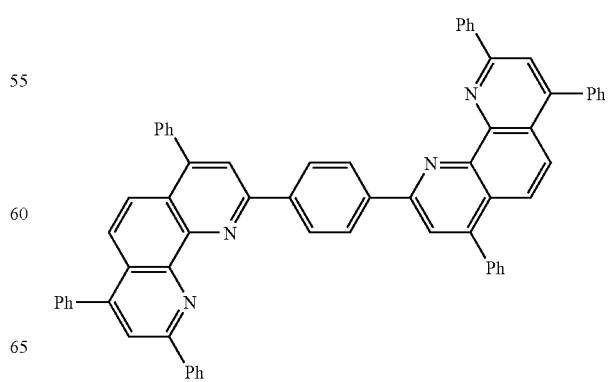

[Chemical 12]
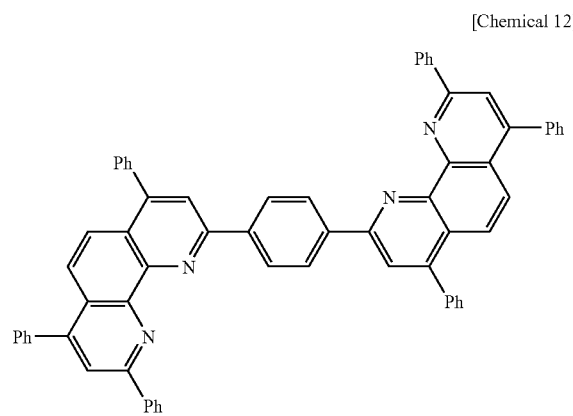
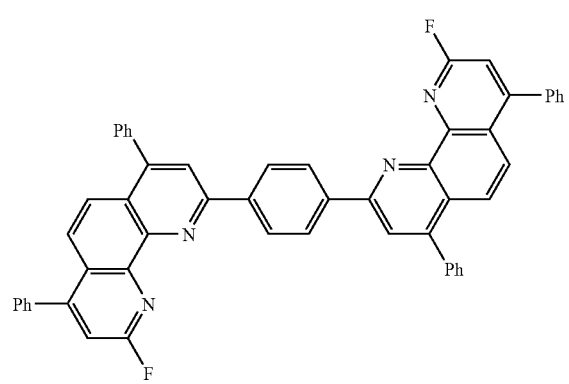
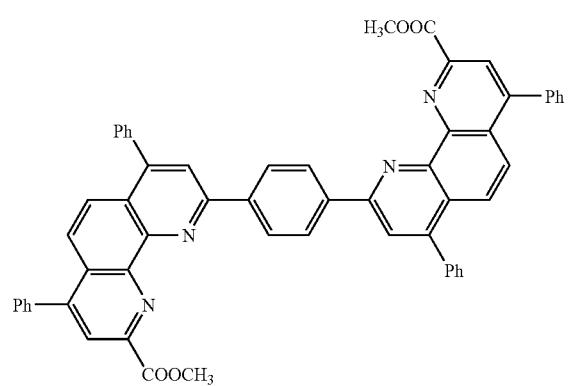
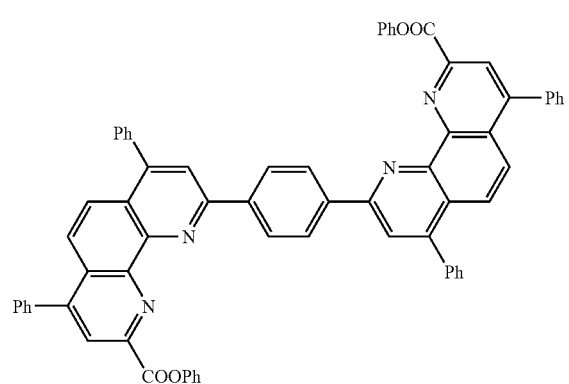
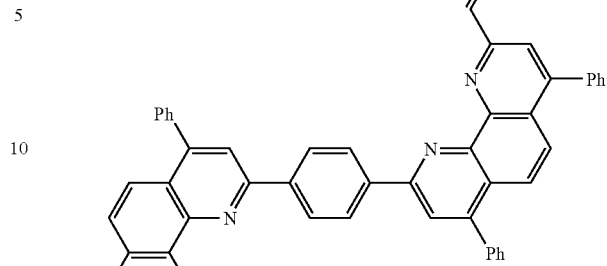
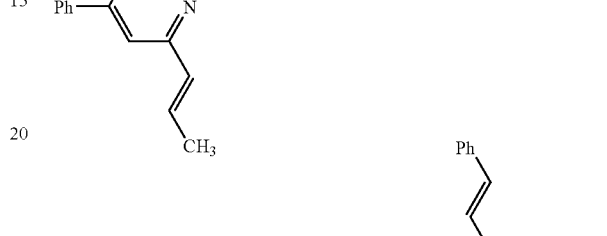
[Chemical 13]
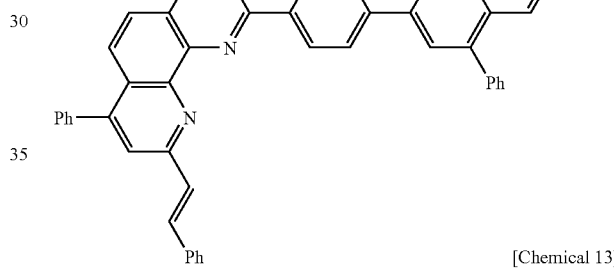
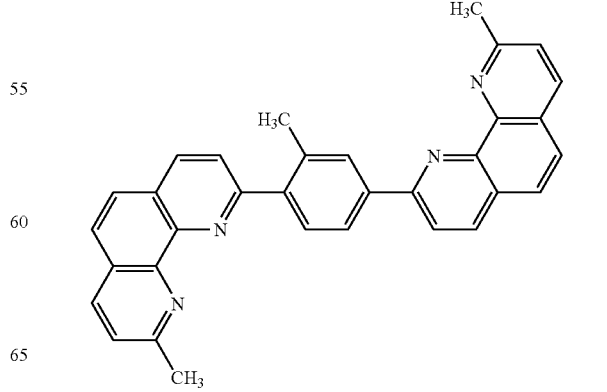

-continued
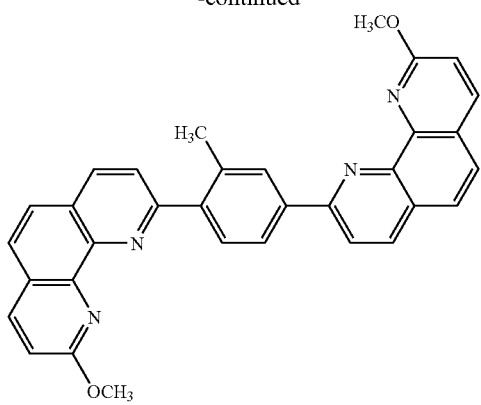
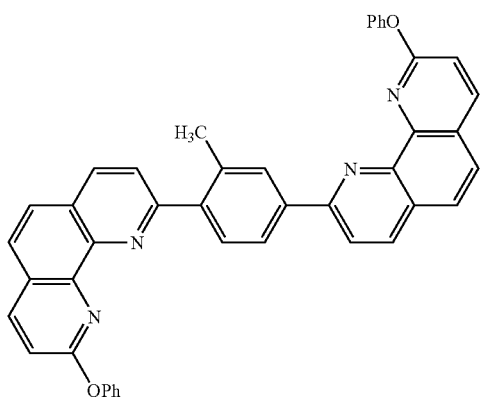
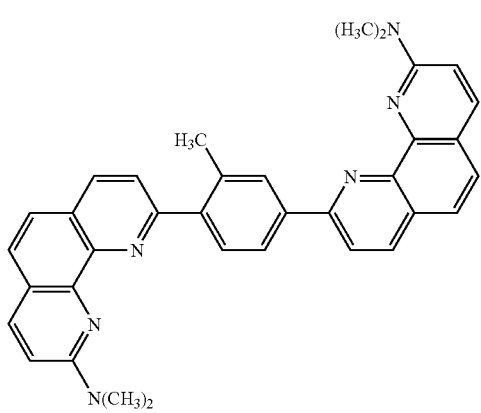
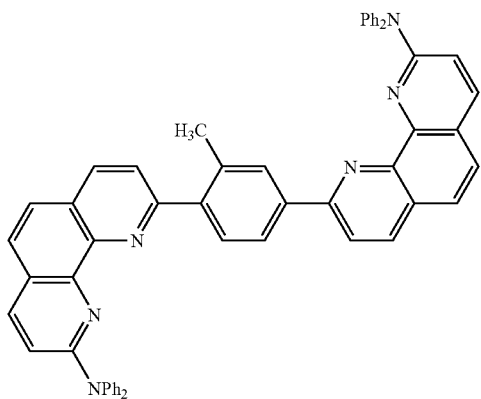
-continued
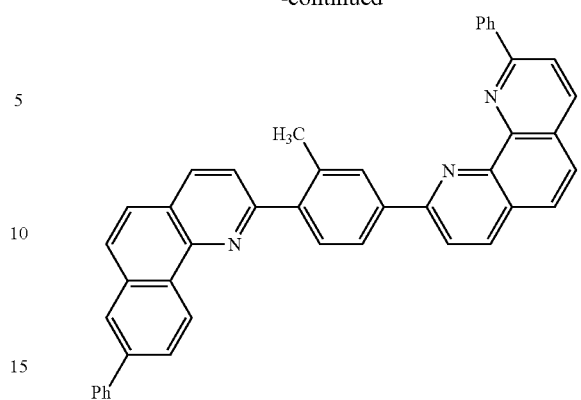
[Chemical 14]
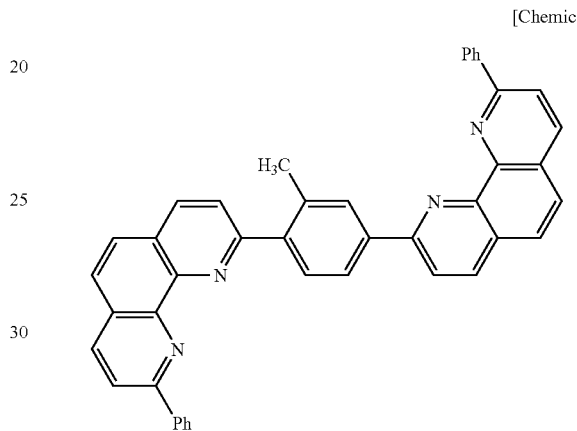
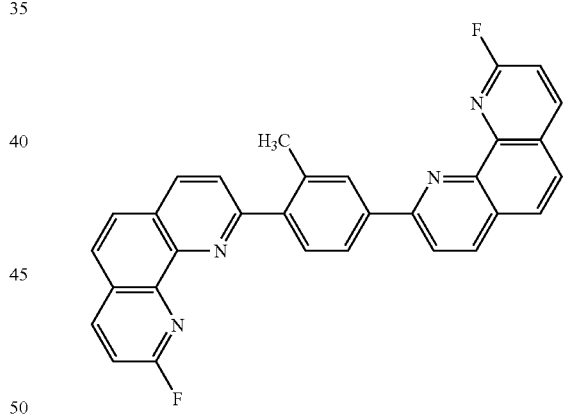
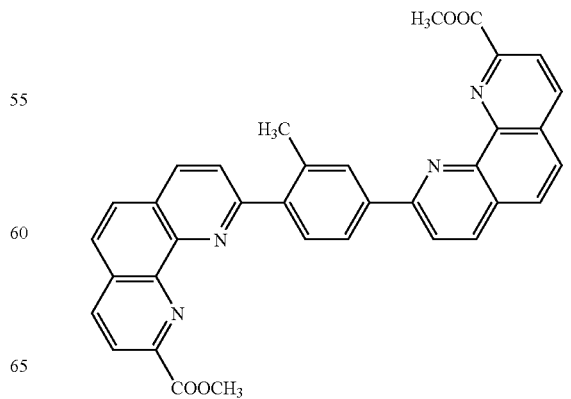

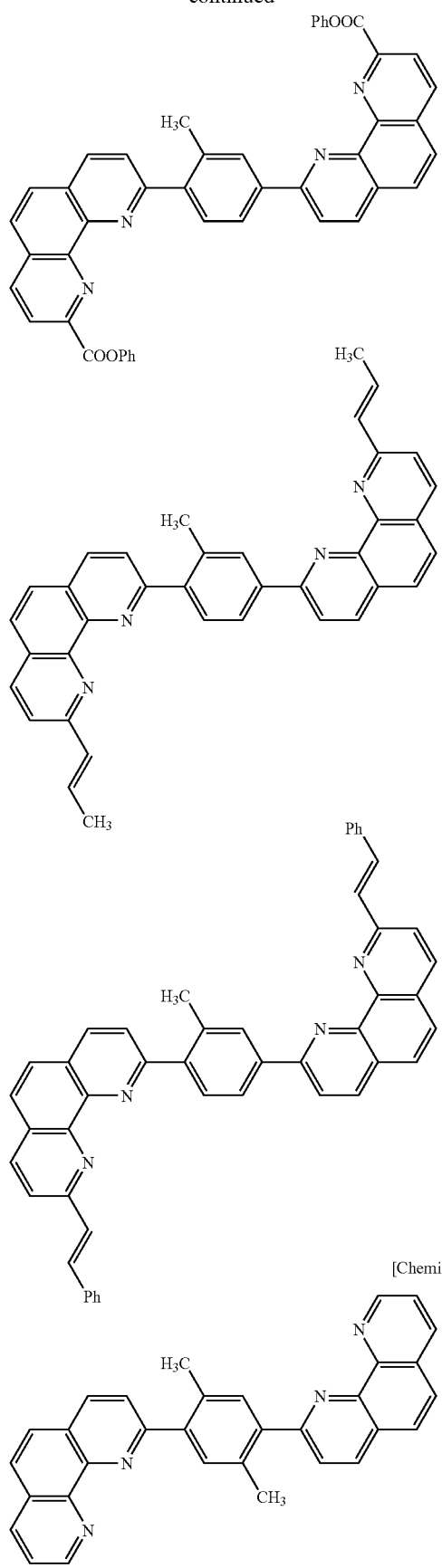
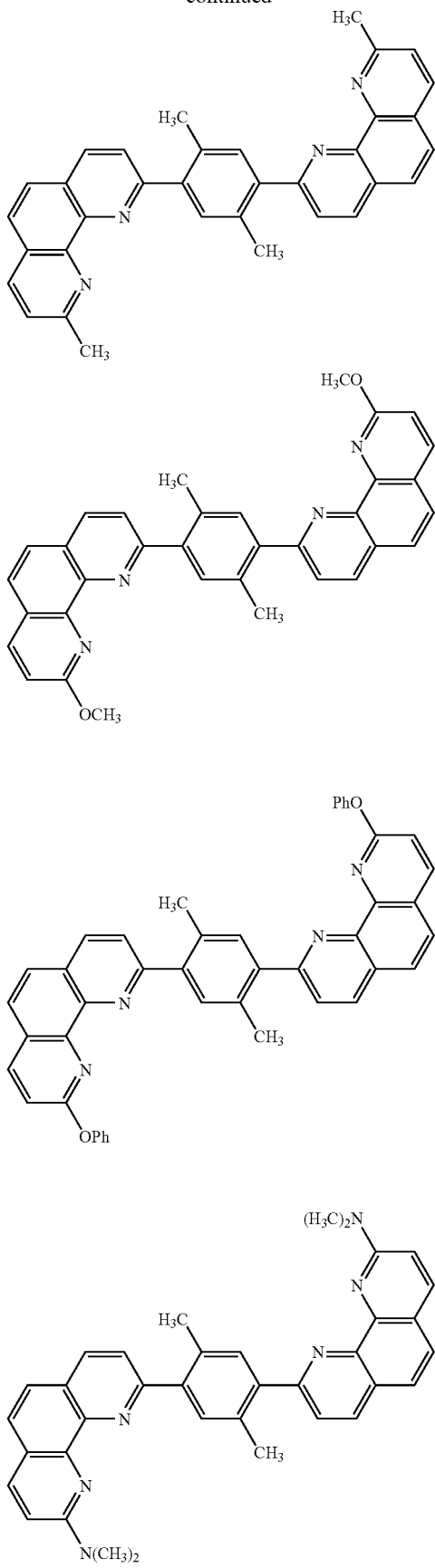

-continued
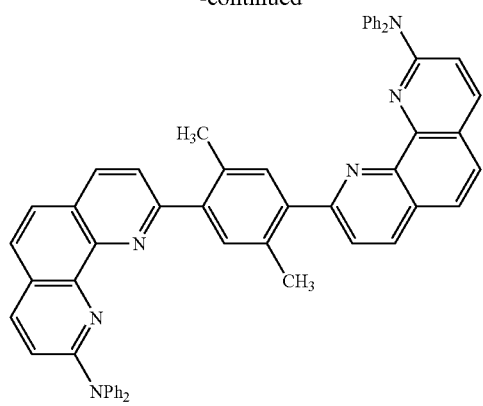
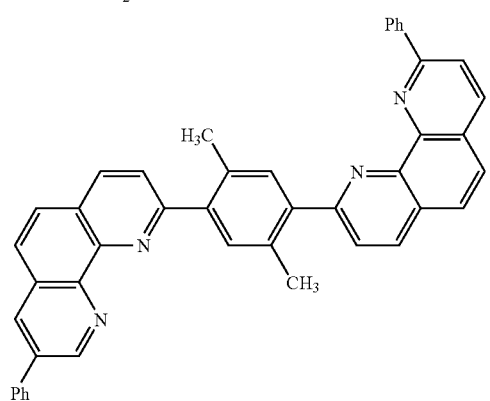
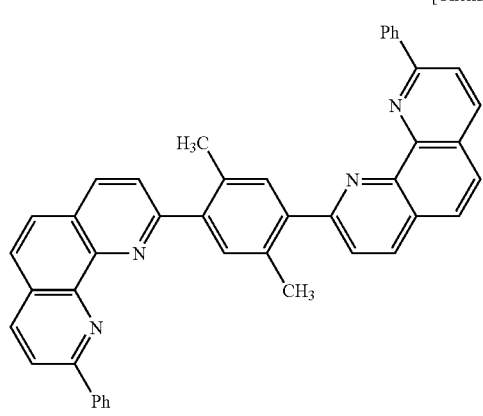
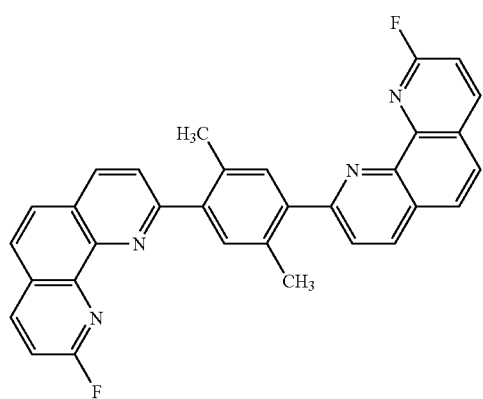
[Chemical 16]
-continued
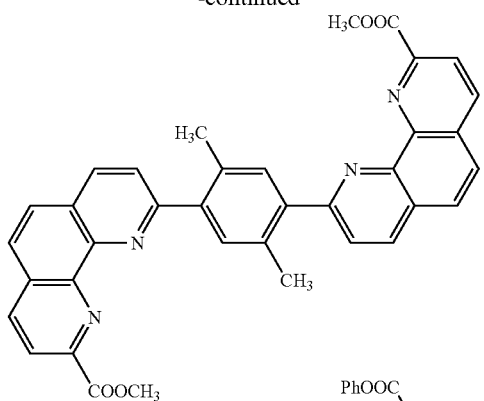
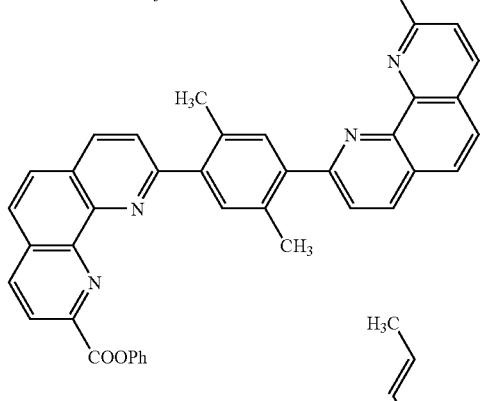
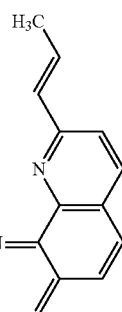
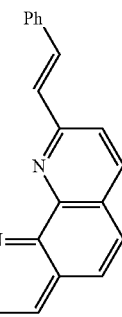

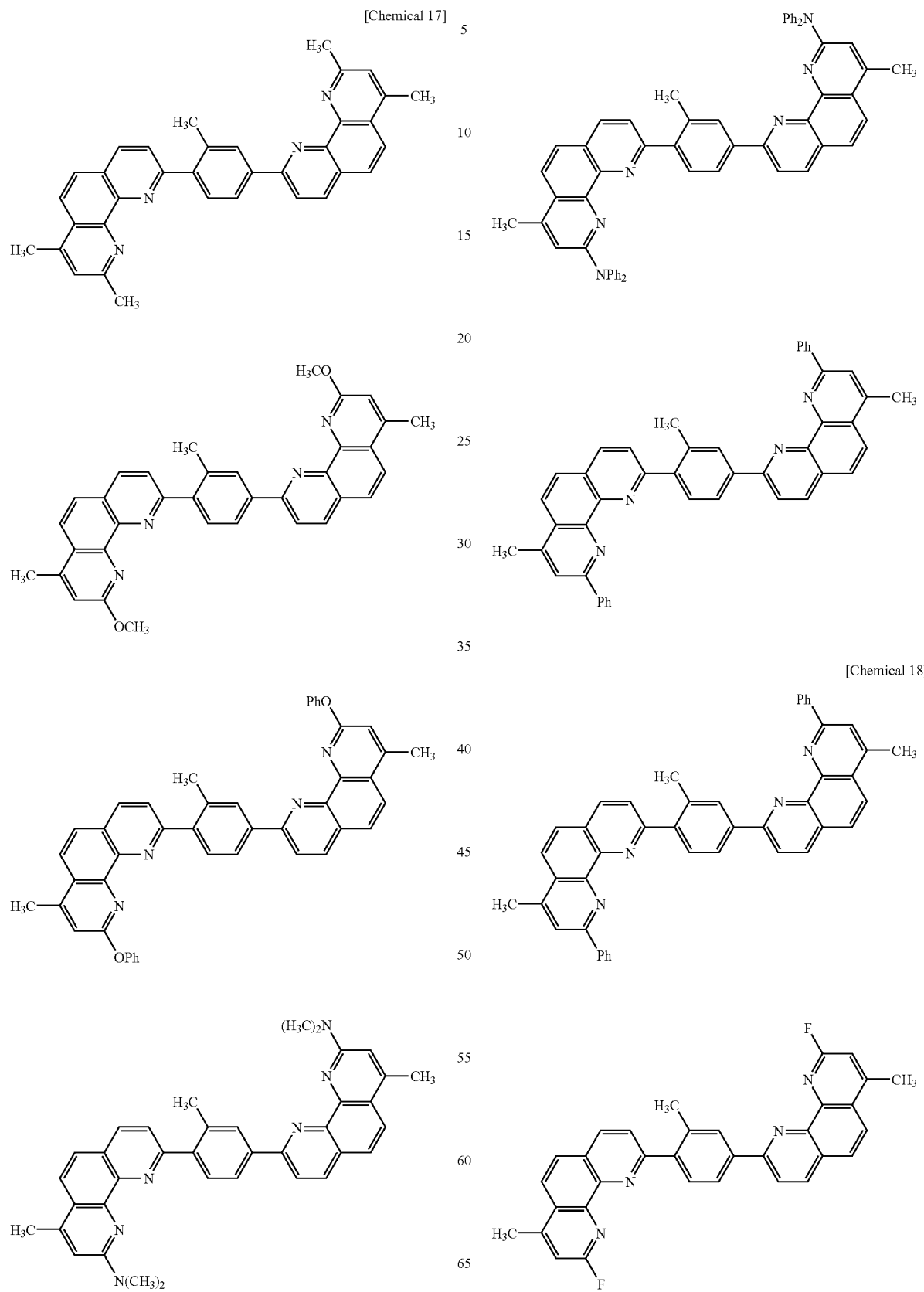

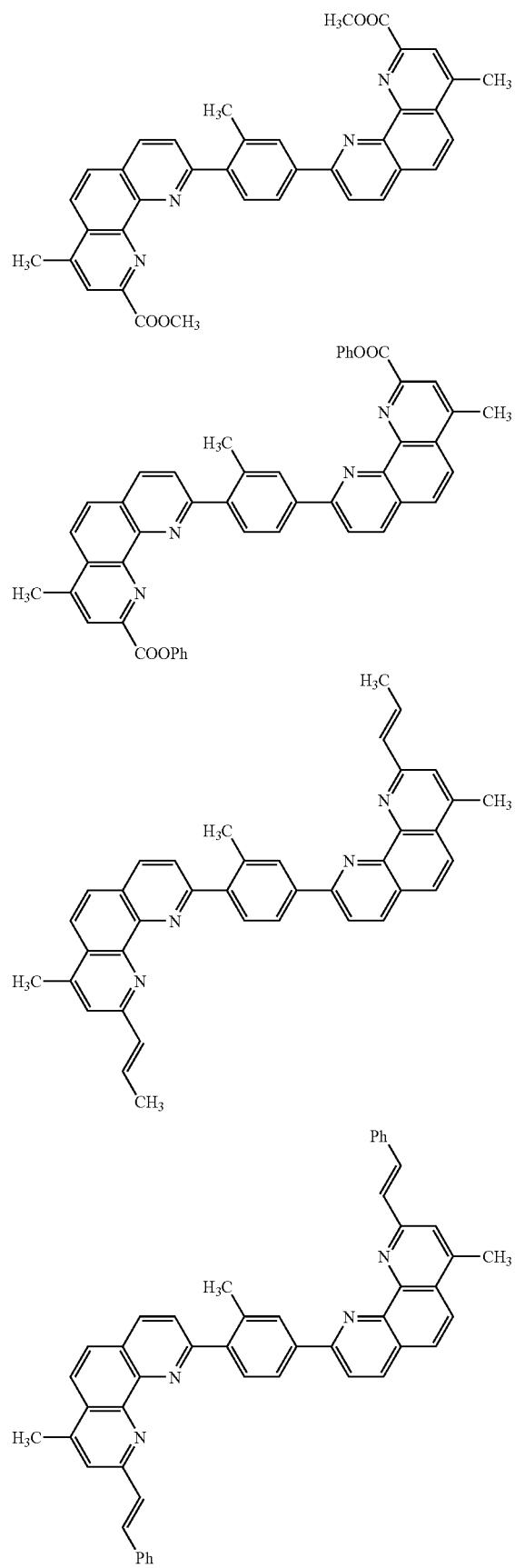
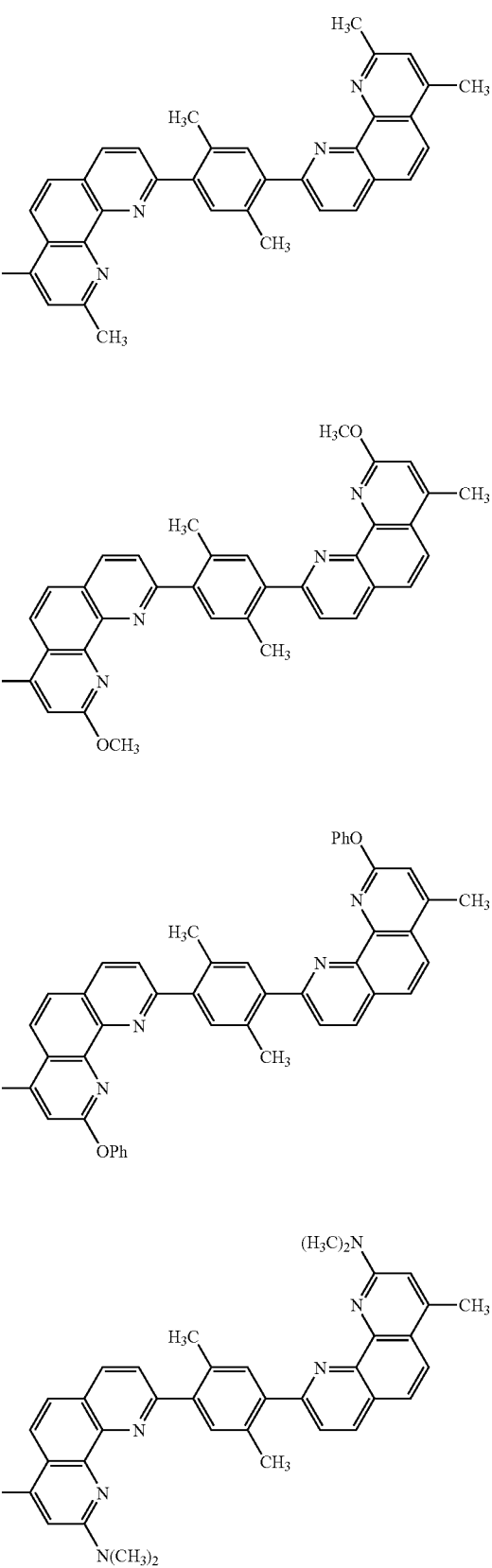
[Chemical 19]

-continued
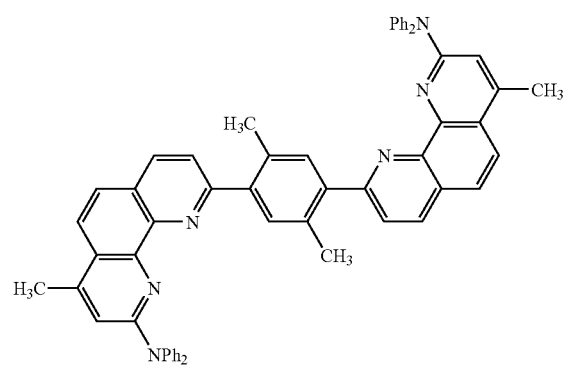
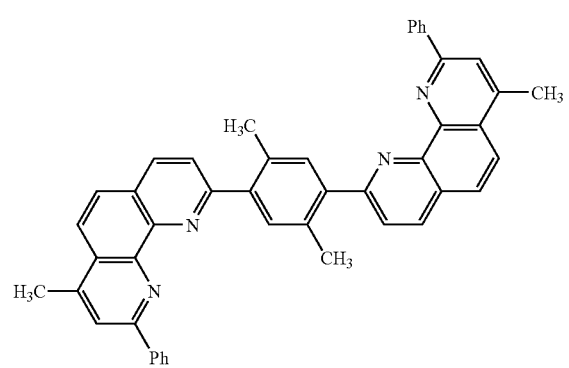
[Chemical 20]
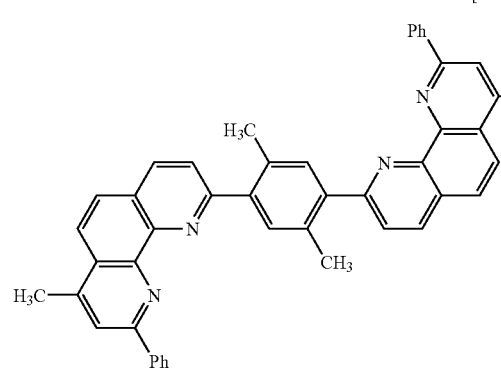
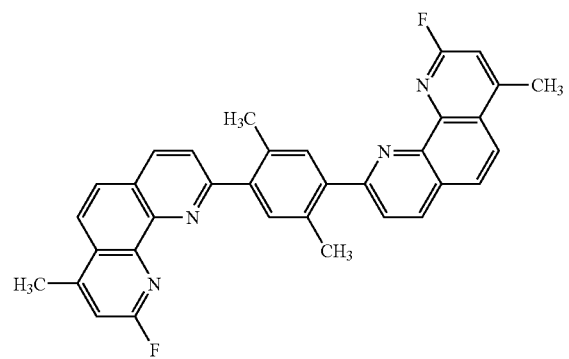
-continued
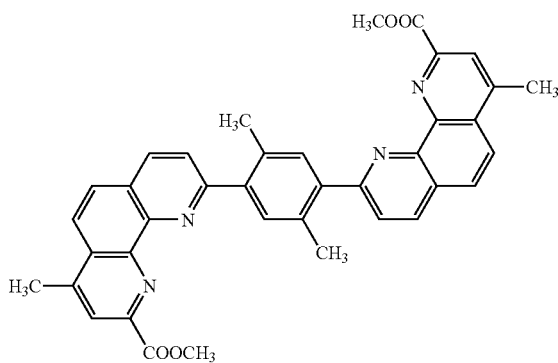
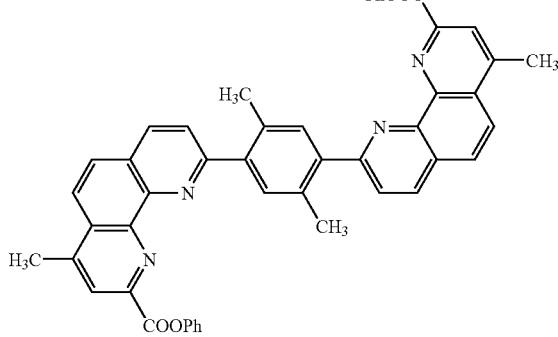
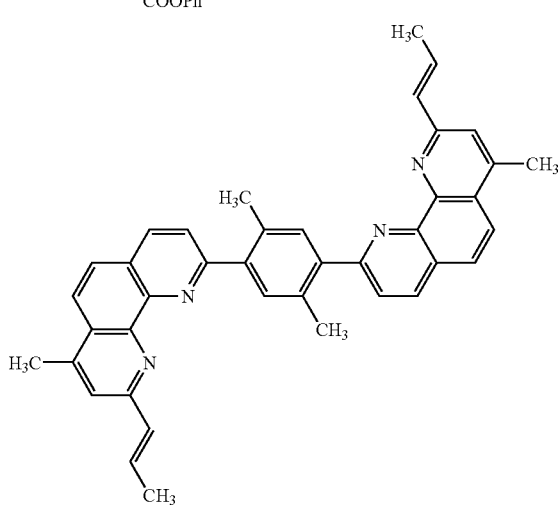
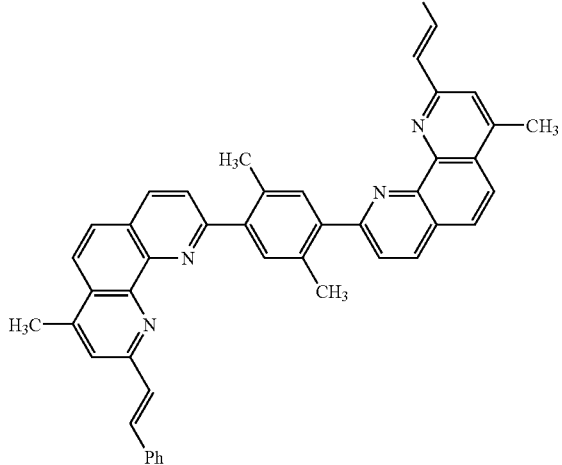

[Chemical 21]
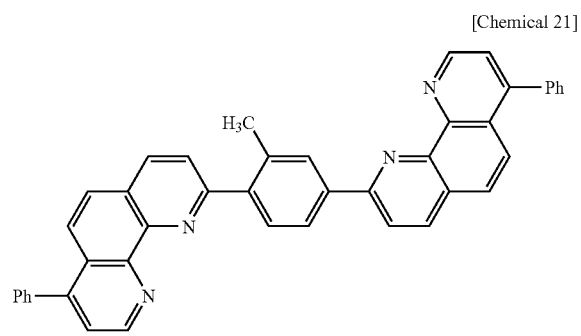
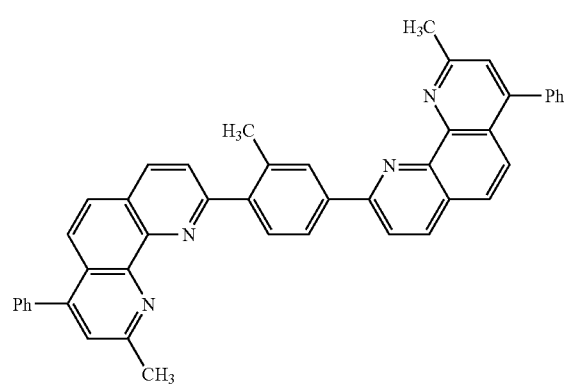
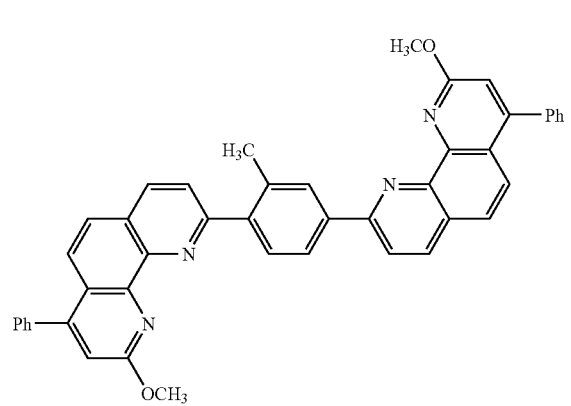
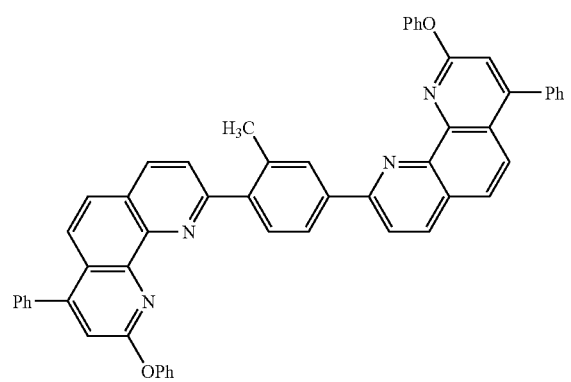
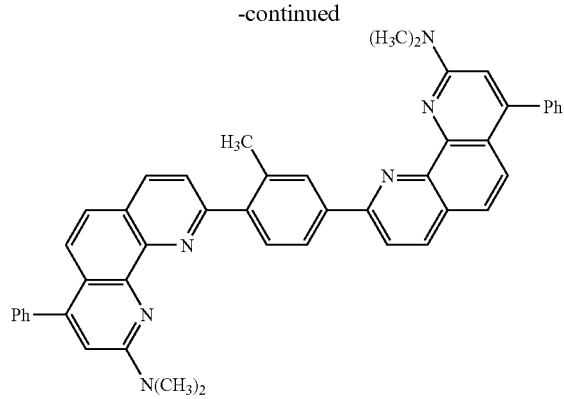
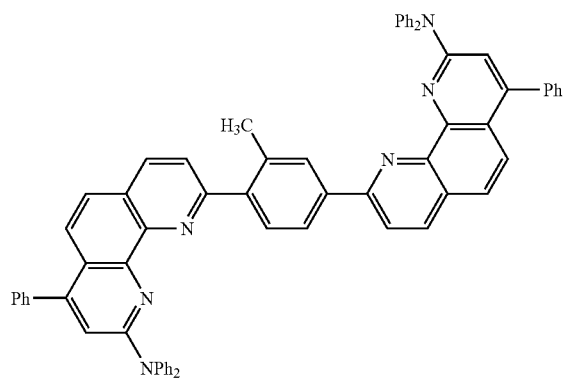
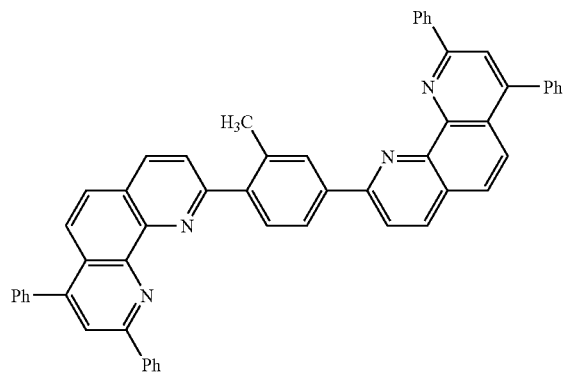
[Chemical 22]
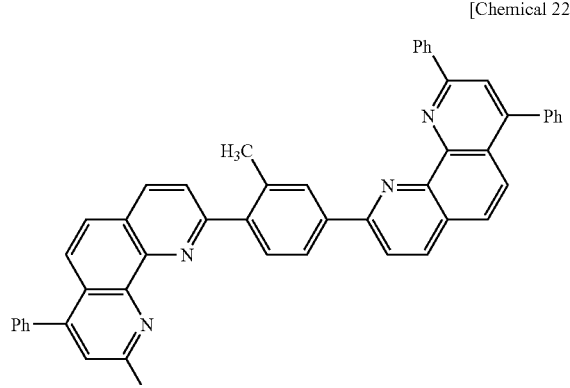

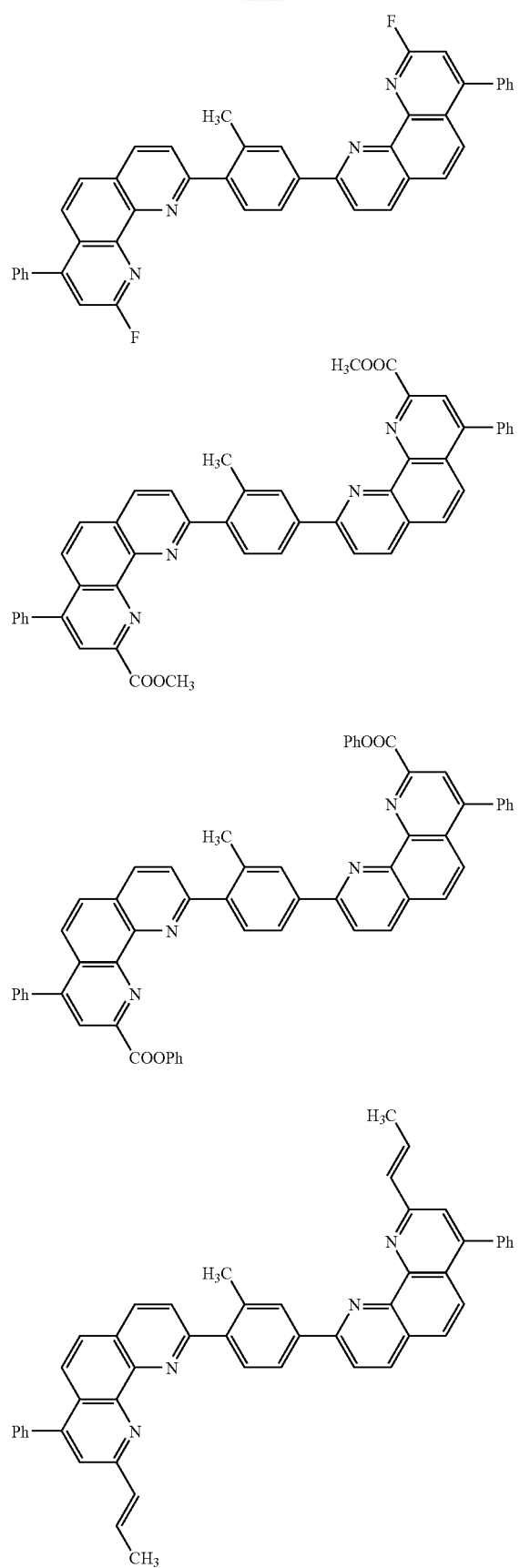
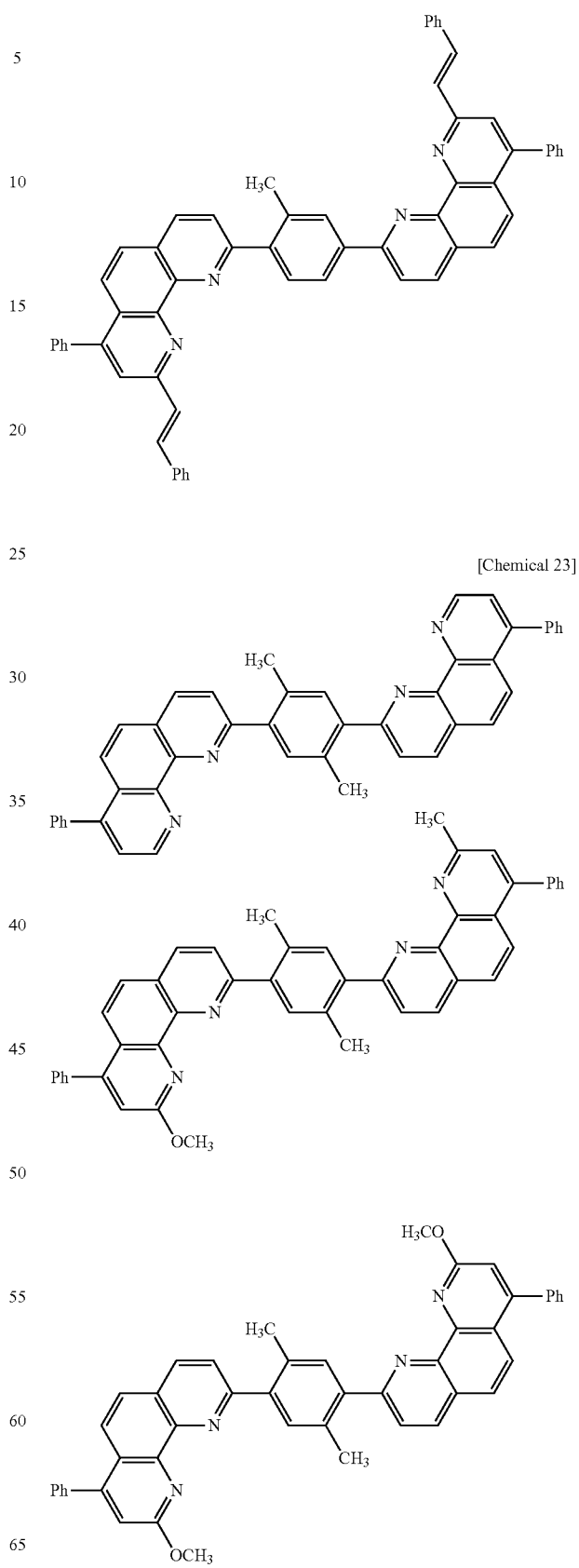
[Chemical 23]

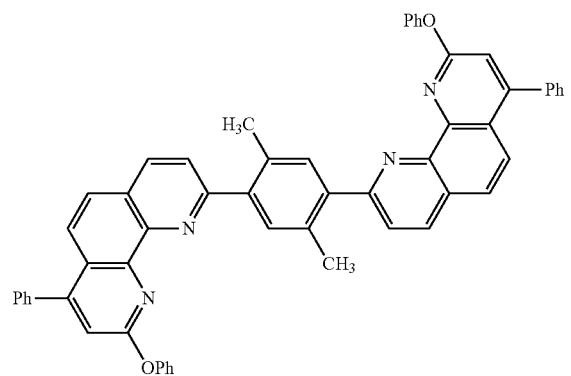
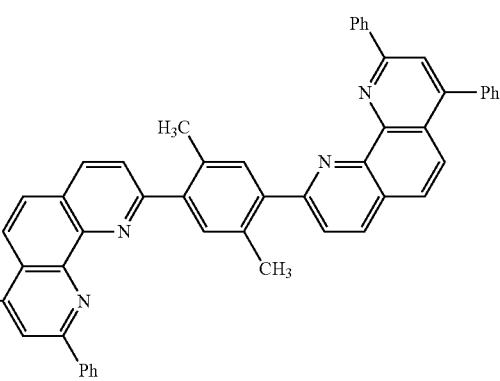
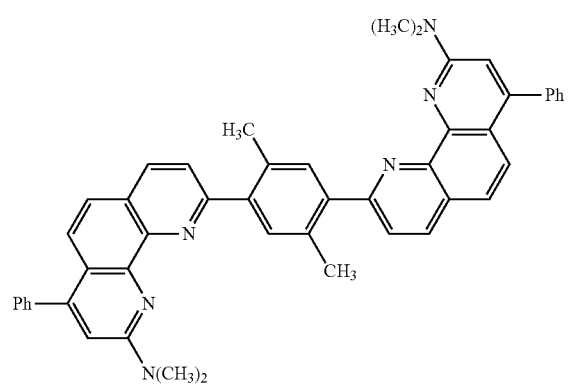
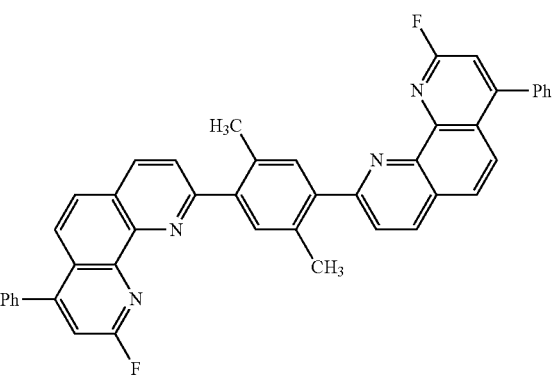
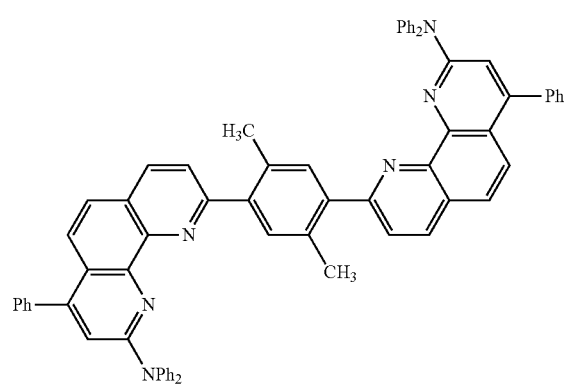
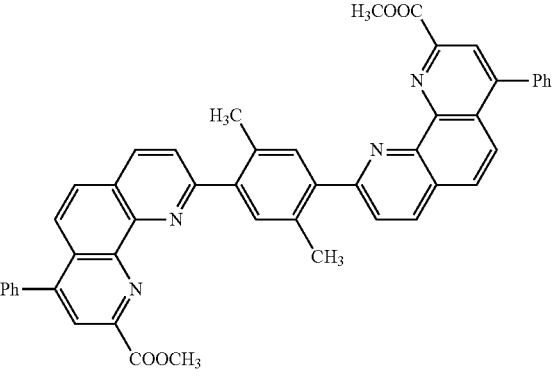
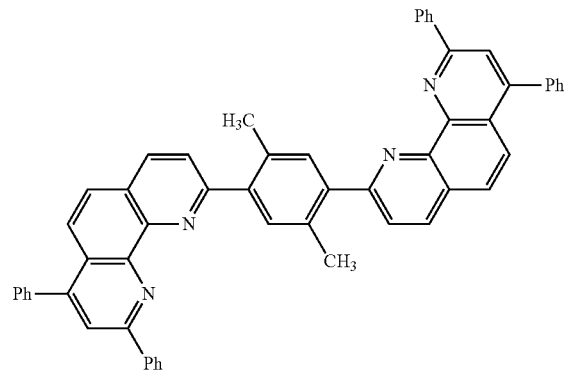
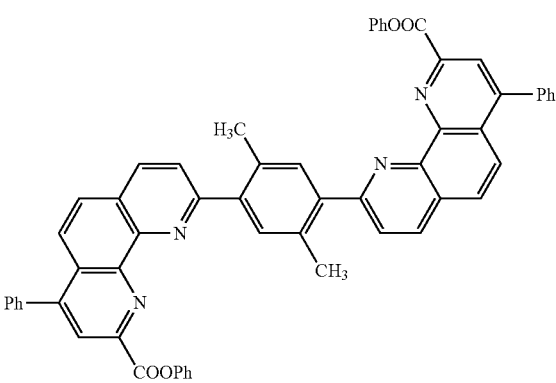

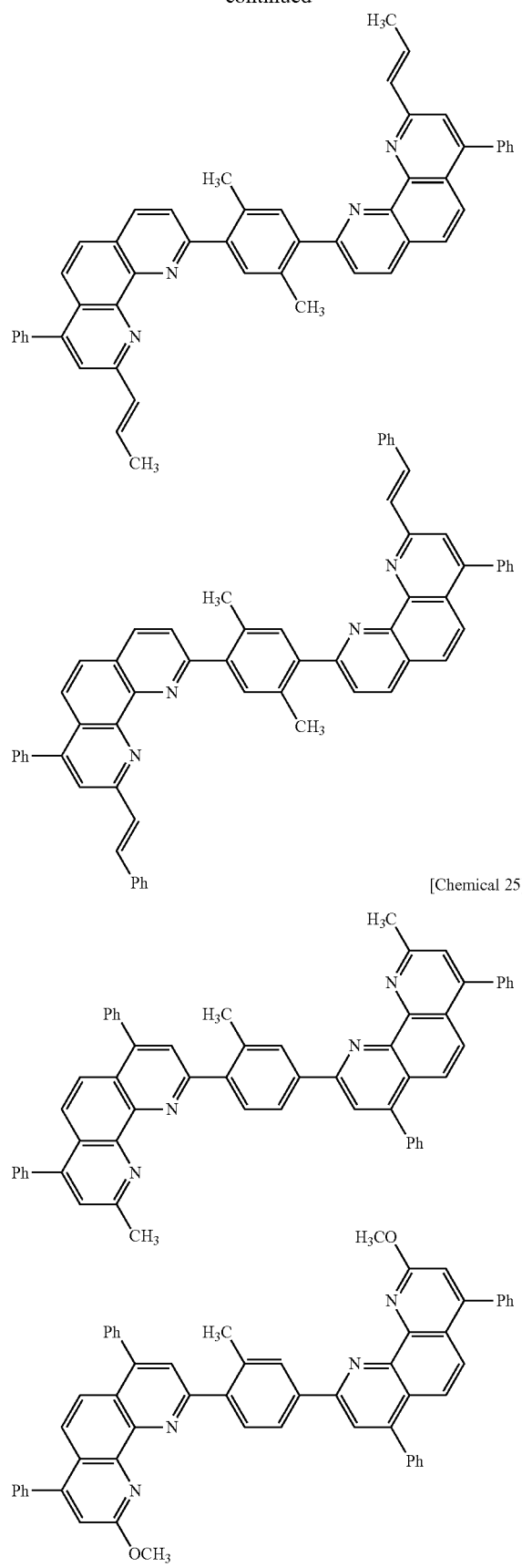
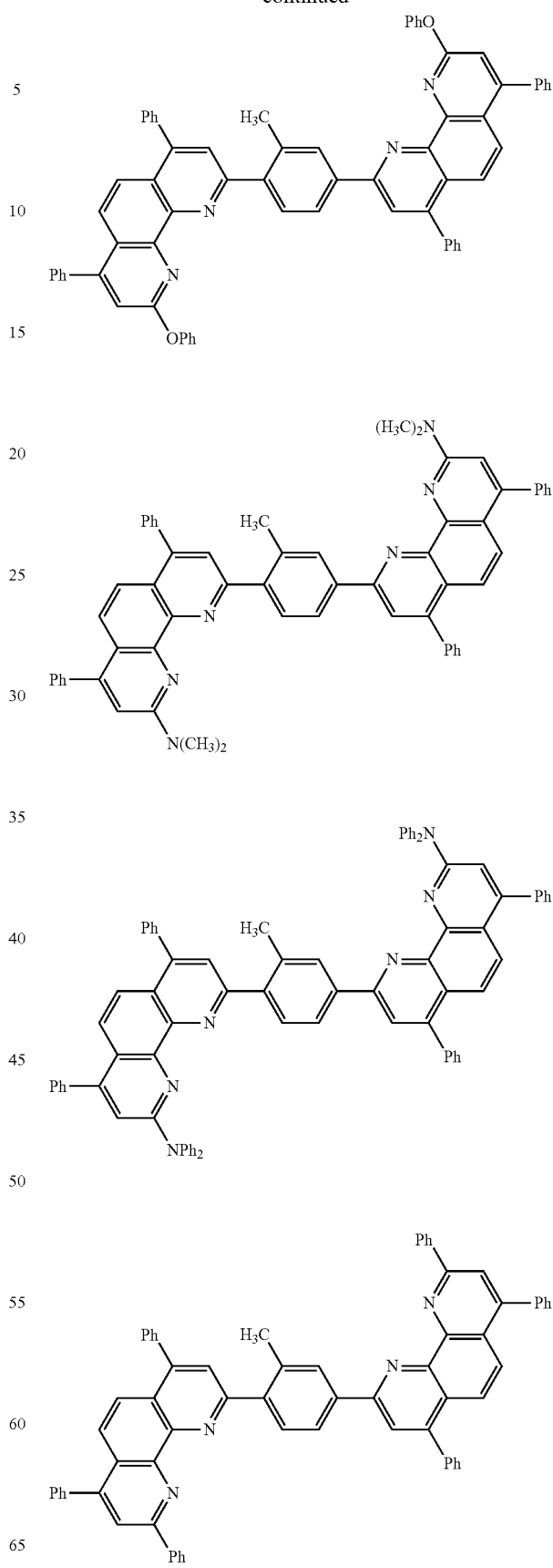

[Chemical 26]
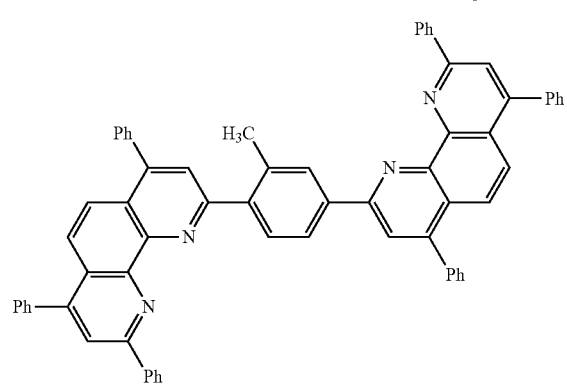
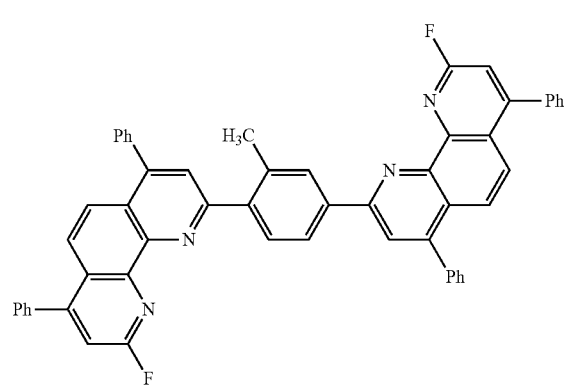
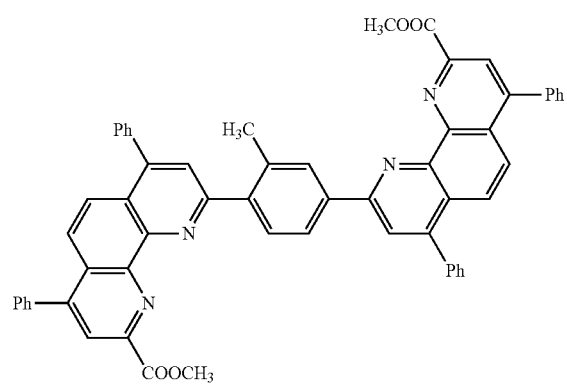
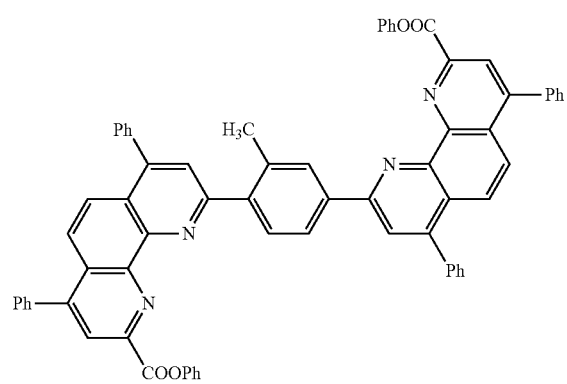
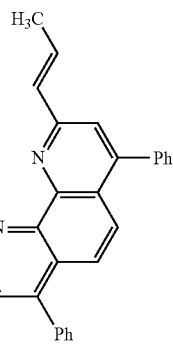
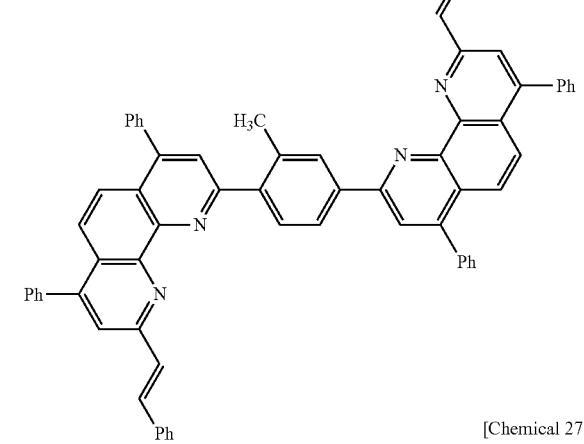
[Chemical 27]
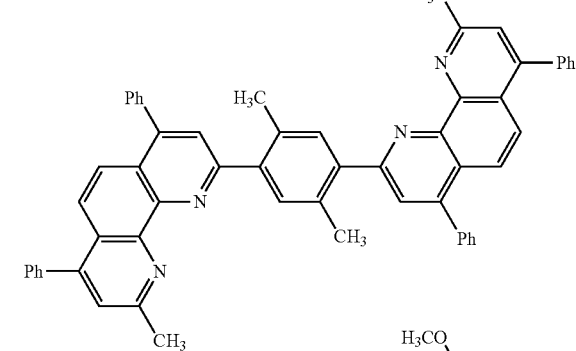
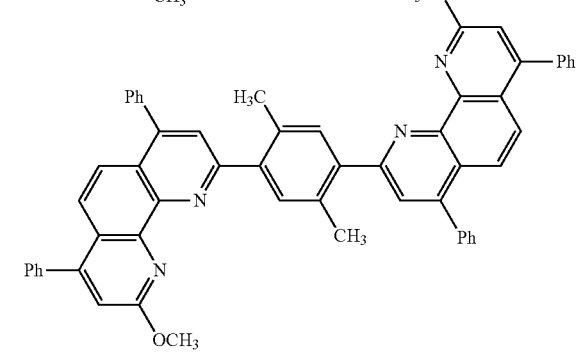

[Chemical 28]
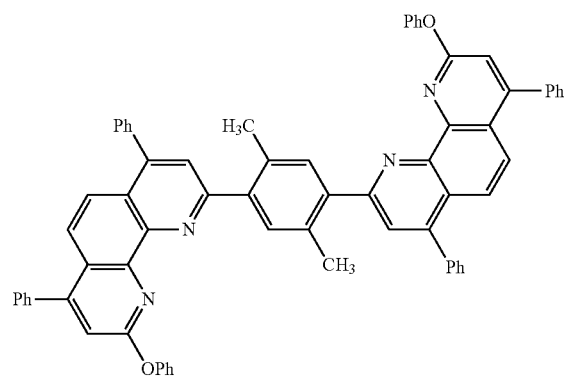
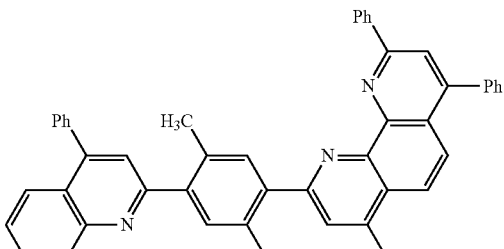
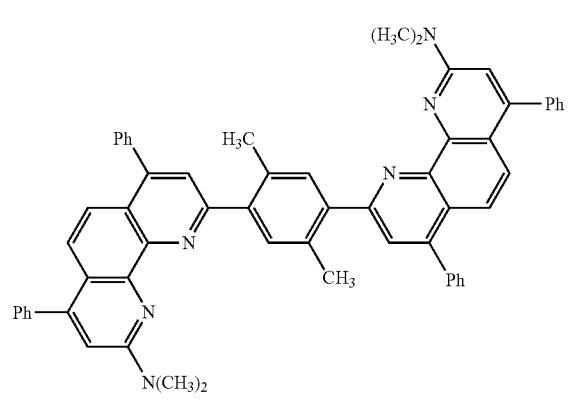
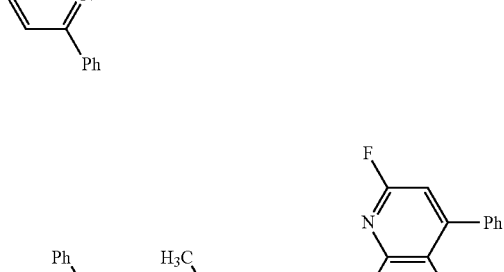
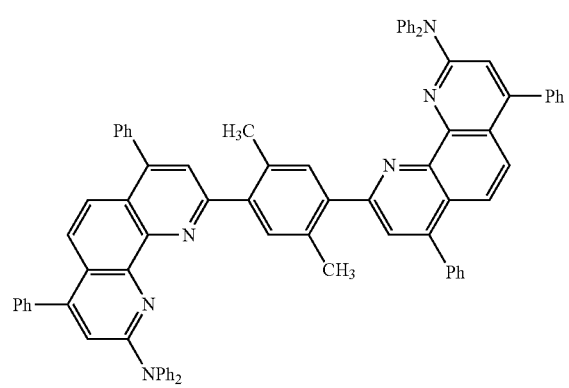
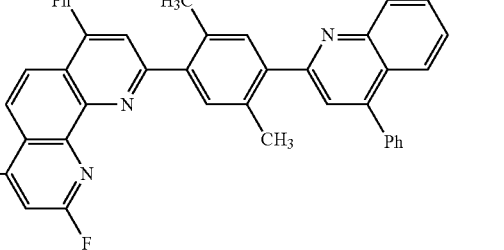
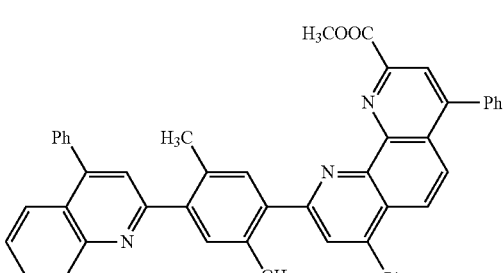
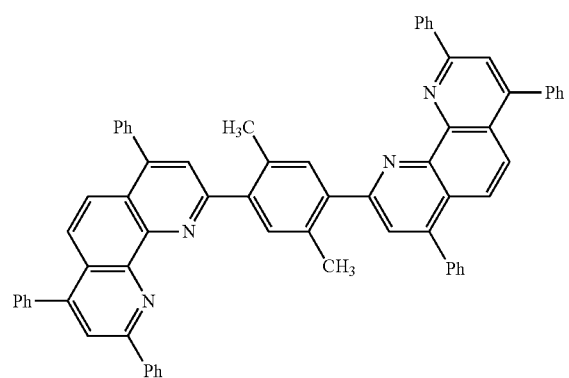
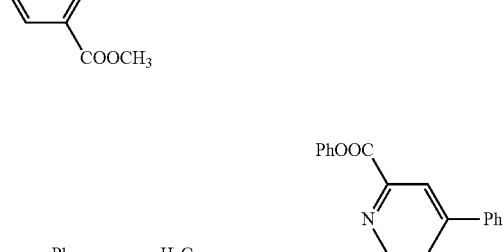
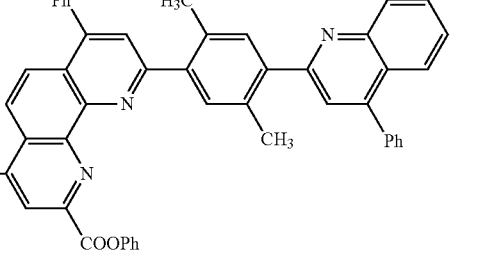

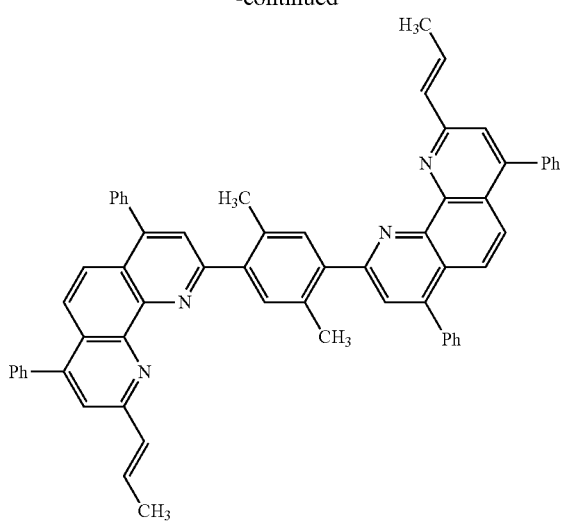

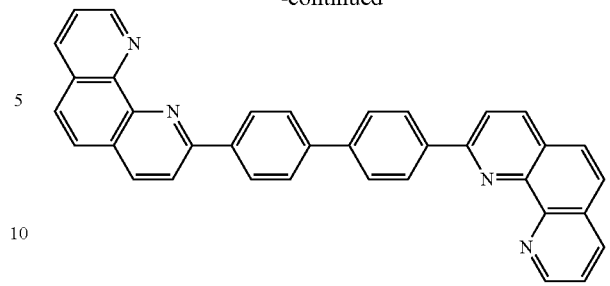

4,4'-di(1,10-phenanthroline-2yl) biphenyl DPBi

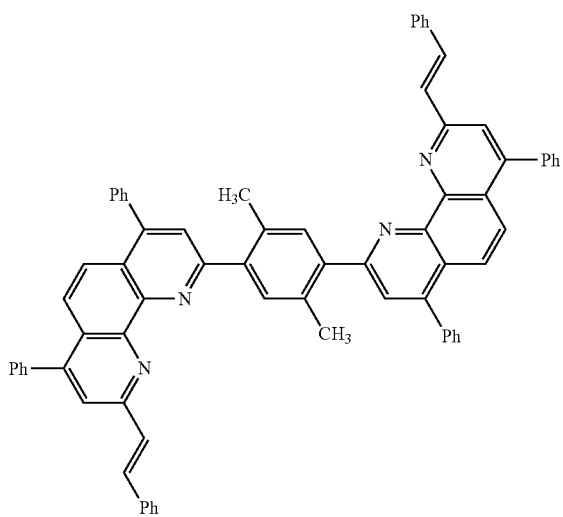

[Chemical 29]

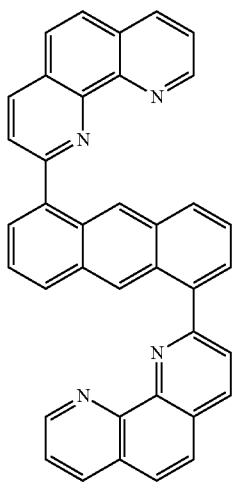

1,5-di(1,10-phenanthroline-2yl) anthracene

In the patterning method of the present invention, it is preferable that a bias is applied between the electrodes 3 and 5 when the ultraviolet ray is irradiated by the method shown in FIG. 1.

By applying a bias, it is possible to accelerate the speed of reducing the brightness even if the ultraviolet ray is irradiated to the organic layer containing an organic material in which the effect of reducing the brightness by the irradiation of the ultraviolet ray is small, such as tris(8-quinolynol)aluminum ($Alq_3$), etc., i.e., in which the speed of reducing the brightness is slow.

Therefore, the efficiency in forming the emission pattern by the irradiation of the ultraviolet ray can be enhanced only by applying a bias.

The organic EL device to which the patterning method of the present invention is applied may have an anode, organic layer, and a cathode, which are successively laminated on a substrate, wherein the organic layer may include a luminous layer of an organic luminescent material, and the organic EL device may further have a multi-layer structure including a hole injecting layer, hole transporting layer, electron transporting layer, and electron injecting layer.

A transparent substrate having light transmittance for visible light is used for the substrate in the organic EL device in the present invention, in case where the side of the substrate is a light emission surface. The light transmittance is preferably 80% or more, more preferably 85% or more, and further more preferably 90% or more.

Examples of the transparent substrate include in general an optical glass such as BK7, BaK1, F2, etc., a glass substrate such as quartz glass, alkali-free glass, boron silicate glass, aluminosilicate glass, etc., an acrylic resin such as PMMA, etc., a polymer substrate such as polycarbonate, polyether sulfonate, polystyrene, polyolefin, epoxy resin, polyester such as polyethylene terephthalate, etc.

It is to be noted that, when the ultraviolet ray is irradiated to the organic layer from the side of the transparent substrate for patterning, the glass substrate such as quartz glass or alkali-free glass is preferably used, since it is difficult to absorb the ultraviolet ray.

The substrate having a thickness of about 0.1 to 10 mm is generally used. Considering the mechanical strength, weight, or the like, the thickness of the substrate is preferably 0.3 to 5 mm, and more preferably 0.5 to 2 mm.

In order to obtain sufficient luminous brightness and in order to sufficiently irradiate ultraviolet ray to the organic layer, it is preferable that a transparent or semi-transparent substrate is used as at least one of the anode and cathode in the organic EL device of the present invention. The term transparent electrode in the present invention includes the semi-transparent electrode.

The anode is composed of a metal, alloy, conductive compound, etc. having a large work function (4 eV or more). Normally, the transparent electrode is used for the anode on the transparent substrate.

Metal oxides such as indium tin oxide (ITO), indium zinc oxide, zinc oxide are generally used for the transparent electrode. In particular, ITO is used suitably in terms of transparency or conductivity.

The thickness of the transparent electrode is preferably 80 to 400 nm, and more preferably 100 to 200 nm for securing transparency and conductivity.

On the other hand, the cathode opposite to the anode is composed of a metal, alloy, conductive compound, or the like having a small work function (4 eV or more). Examples of the material for the cathode include aluminum, aluminum-lithium alloy, magnesium-silver alloy, etc.

The thickness of the cathode is preferably 10 to 500 nm, and more preferably 50 to 200 nm.

The anode and cathode can be formed by the film formation method generally used, such as a sputtering method, ion plating method, deposition, etc.

The material for the hole injecting layer, hole transporting layer, luminous layer, electron transporting layer, and electron injecting layer in the organic layer of the organic EL device of the present invention is not particularly limited, but any known material can be used, and further, either one of low-molecular material and high-molecular material can be used.

It is to be noted that, it is necessary for the organic layer to contain a compound, such as the polynuclear phenanthroline derivative represented by DPB and expressed by the formula (I), that can be patterned by the irradiation of the ultraviolet ray.

Each of the layers in the organic layer can be formed by generally used various film formation methods such as a spin coating method, vacuum deposition method, etc.

The thickness of each layer can appropriately be determined according to the condition considering the adaptability among each layer or desired whole thickness, but is preferably within the range of 5 nm to 5 μm in general.

The constituent of the organic layer in the organic EL device of the present invention will specifically be explained.

Examples of the luminescent materials forming the luminous layer include low-molecular luminescent materials such as 9,10-diarylanthracene derivative, pyrene, coronene, perylene, rubrene, 1,1,4,4-tetraphenyl butadiene, tris(8-quinolate) aluminum complex, tris(4-methyl-8-quinolate) aluminum complex, bis(8-quinolate) zinc complex, tris(4-methyl-5-trifluoromethyl-8-quinolate) aluminum complex, tris(4-methyl-5-cyano-8-quinolate) aluminum complex, bis (2-methyl-5-trifluoromethyl-8-quinolinolate) [4-(4-cyanophenyl)phenolate]aluminum complex, bis(2-methyl-5-cyano-8-quinolinolate) [4-(4-cyanophenyl)phenolate] aluminum complex, tris(8-quinolylate) scandium complex, bis[8-p-tosyl]aminoquinoline]zinc complex or cadminum complex, 1,2,3,4-tetraphenyl cyclopentadiene, poly-2,5-diheptyloxy-p-phenylenevinylene, etc.

Further, examples further include the one obtained by dispersing a low-molecular material of a phosphorescent material such as coumarin-based phosphor, perylene-based phosphor, pyrane-based phosphor, anthrone-based phosphor, porphyrin-based phosphor, quinacridone-based phosphor, N,N'-dialkyl-substituted quinacridone-based phosphor, naphthalimide-based phosphor, N,N'-diaryl-substituted-pyrrolopyrrole-based phosphor, iridium complex, etc. dispersed in a high-molecular material such as polystyrene, polymethyl methacrylate, polyvinylcarbazole, etc.

Other examples include PPP derivative such as poly(2-decyloxy-1,4-phenylene) (DO-PPP), poly[2,5-bis-[2-(N,N, N-triethyl ammonium)ethoxy]-1,4-phenyl-o-1,4-phenylene] dibromide, etc., and high-molecular material such as poly[2-(2'-ethylhexyloxy)-5-methoxy-1,4-phenylenevinylene] (MEH-PPV), poly[5-methoxy-(2-propanoxysulfonide)-1,4-phenylenevinylene] (MPS-PPV), poly[2,5-bis(hexyloxy)-1, 4-phenylene (1-cyanovinylene)] (CN-PPV), poly(9,9-dioctylfluorene) (PDAF), polyspirofluorene, etc. Further, a high-molecular precursor such as PPV precursor, PPP precursor, etc. and other existing luminescent materials can be used.

Examples of the hole transporting material forming the hole transporting layer include metal phthalocyanines or metal-free phthalocyanines such as copper phthalocyanine, tetra(t-butyl) copper phthalocyanine, etc., aromatic amine-based low-molecular materials such as quinacridone compound, 1,1-bis(4-di-p-tolylaminophenyl) cyclohexane, N,N'-diphenyl-N,N'-bis(3-methylphenyl)-1,1'-biphenyl-4,4'-diamine, N,N'-di(1-naphthyl)-N,N'-diphenyl-1,1'-biphenyl-4,4'-diamine, etc., high-molecular material such as polyaniline, polythiophene, polyvinylcarbazole and mixtures of poly(3,4-ethylenedioxythiophene) with polystyrenesulfonic acid, thiophene oligomer materials, and other existing hole transport materials.

The above-mentioned polynuclear phenanthroline derivatives are suitably used as the electron transporting material for forming the electron transporting layer, and other than the polynuclear phenanthroline derivatives, examples of the electron transporting material include 2-(4-biphenylyl)-5-(4-t-butylphenyl)-1,3,4-oxadiazole, oxadiazole derivatives, bis (10-hydroxybenzo[h]quinolinolate) beryllium complexes, triazole compounds and the like.

The materials same as the hole injection can be used as the hole transporting materials, and the hole transporting materials and hole injecting materials may be formed into a single layer, formed by the combination of different materials, or formed into plural layers. The same is true for the relationship between the electron transporting materials and the electron injecting materials.

Some of the materials described above have the function as the luminescent materials.

Examples of the solvent for dissolving or dispersing the luminescent materials include toluene, xylene, acetone, hexane, methyl ethyl ketone, methyl isobutyl ketone, cyclohexanone, methanol, ethanol, isopropyl alcohol, ethyl acetate, butyl acetate, 2-methyl-(t-butyl) benzene, 1,2,3,4-tetramethylbenzene, pentylbenzene, 1,3,5-triethylbenzene, cyclohexylbenzene, 1,3,5-tri-isobutylbenzene, etc. The solvents described above can be used singly or these solvents can be mixed. An additive such as a surfactant, an oxidization inhibitor, a viscosity modifier or an ultraviolet absorbent may be added to these solvents as needed.

Examples of the solvent for dissolving or dispersing the hole transporting or injecting materials or electron transporting or injecting materials include toluene, xylene, actone, methyl ethyl ketone, methyl isobutyl ketone, cyclohexanone, methanol, ethanol, isopropyl alcohol, ethyl acetate, butyl acetate, water, etc. These solvents can be used singly, or these solvents can be mixed.

EXAMPLES

The present invention will be explained in more detail with reference to examples. However, the invention is not limited by the examples described below.

Example 1

The organic EL device with a thickness of 10 mm×10 mm having the structure described below was manufactured. Specifically, a transparent electrode having formed thereon an ITO film with a thickness of 150 nm was formed on a glass substrate having a thickness of 0.7 mm. Formed on the transparent electrode were a molybdenum trioxide doped N,N'-di(naphthalene-1-yl)-N,N'-diphenyl benzidine (α-NPD) film with a thickness of 10 nm serving as a hole injecting layer, an α-NPD film with a thickness of 21 nm serving as a hole transporting layer, a film composed of tris(8-quinolynol)aluminum(Alq$_3$) and a compound of 2,3,6,7-tetrahydro-1,1,7,7-tetramethyl-10-(thiazole-2-yl)-1H,5H,11H-[1]benzopyrano[6,7,8-ij]quinolizin-11-one (NKX-1595) expressed by

[Chemical 30]

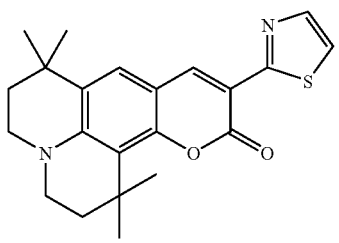

with a thickness of 30 nm serving as a luminous layer, a DPB film having a thickness of 32 nm serving as an electron transporting layer, a film composed of DPB and mono(8-quinolynolate) lithium complex (Liq) with a thickness of 10 nm serving as an electron injecting layer, and an aluminum film with a thickness of 60 nm serving as a backside electrode (counter electrode), these layers being successively laminated.

The organic EL device at the side of the transparent substrate was covered by an ultraviolet shading mask having an opening with a diameter of 2 mm, and ultraviolet ray (peak wavelength: 365 nm, 150 mW/cm$^2$) was irradiated thereto in a predetermined amount.

The luminous state of the EL device when the ultraviolet ray was irradiated in 1.5 J/cm$^2$, the luminous state when the ultraviolet ray was irradiated in 7.5 J/cm$^2$, the luminous state when the ultraviolet ray was irradiated in 15.0 J/cm$^2$ and the luminous state when the ultraviolet ray was not irradiated were observed and compared.

As a result of the visual observation, in case where the ultraviolet ray was irradiated in 1.5 J/cm$^2$ and where the ultraviolet ray was not irradiated, the whole surface of the device emits green light. When the ultraviolet ray was irradiated in 7.4 J/cm$^2$ and 15.0 J/cm$^2$, the green light emission is dark only at the mask opening portion.

Ultraviolet ray was irradiated to the whole surface of the organic EL device manufactured in the same manner as in the above-mentioned case without using a mask, and the brightness reduction and brightness-voltage characteristic by the irradiation of the ultraviolet ray were evaluated.

Table 1 shows, as the evaluation result of the brightness reduction, the relationship between the ratio of the brightness of the device after the irradiation of the ultraviolet ray to the brightness when the ultraviolet ray was not irradiated and the integrated light quantity.

Examples 2 and 3

An organic EL device was manufactured in the same manner as in Example 1 except that the thickness of the α-NPD film serving as the hole transporting layer was set to 50 nm (Example 2) or set to 80 nm (Example 3).

The observation and evaluation of each organic EL device after the irradiation of the ultraviolet ray were performed in the same manner as in Example 1.

As a result of the visual observation, in case where the ultraviolet ray was irradiated in 1.5 J/cm$^2$ and where the ultraviolet ray was not irradiated, the whole surface of the device emits green light. When the ultraviolet ray was irradiated in 7.5 J/cm$^2$ and 15.0 J/cm$^2$, the green light emission is slightly dark only at the mask opening portion. Compared to Example 1, the green light emission became darker in Example 2, and further darker in Example 3. The green light emission was slightly darker in the case of the irradiation amount of the ultraviolet ray of 15.0 J/cm$^2$ than the case of the irradiation amount of the ultraviolet ray of 7.5 J/cm$^2$.

Table 1 shows the result of the evaluation of the brightness reduction.

The same evaluation of the brightness-voltage characteristic for the device in Example 2 was carried out 60 days after the irradiation of the ultraviolet ray.

Comparative Example 1

An organic EL device was manufactured in the same manner as in Example 2 except that Alq$_3$ was used instead of the DPB for the electron transporting layer and the electron injecting layer.

The observation and evaluation of the organic EL device after the irradiation of the ultraviolet ray were performed in the same manner as in Example 1.

As a result of the visual observation, the whole surface of the device emitted green light regardless of the irradiation amount of the ultraviolet ray.

Table 1 shows the result of the evaluation of the brightness reduction.

TABLE 1

| (%) | Integrated light quantity (J/cm$^2$) | | | |
|---|---|---|---|---|
| | 0 | 7.5 | 15 | 30 |
| Example 1 | 100 | 56 | 27 | 8 |
| Example 2 | 100 | 76 | 46 | 22 |
| Example 3 | 100 | 81 | 64 | 41 |
| Comparative Example 1 | 100 | 97 | 99 | 101 |

It was found from the comparative observation of the luminous states and the result of the evaluation of the brightness reduction of Examples 1 to 3 and Comparative Example 1 shown in Table 1 that the device using Alq$_3$ for the electron transporting material (Comparative Example 1) emitted green light regardless of whether the ultraviolet ray was irradiated or not, and the brightness reduction did not appear.

On the other hand, although the device using DPB for the electron transporting material (Examples 1 to 3) emitted green light, it was confirmed that the brightness at the area where the ultraviolet ray was irradiated was reduced with the increase of the integrated light quantity of the irradiation of the ultraviolet ray.

Comparing Examples 1 to 3, it was observed that the effect of reducing the brightness by the irradiation of the ultraviolet ray was small as the α-NPD film for the hole transporting layer was thick.

It was found from the result of the evaluation of the brightness-voltage characteristic that the voltage of the device was increased with the increase of the integrated light quantity of the irradiation of the ultraviolet ray. In this case, no change appears in the brightness-current density efficiency.

The voltage of the device (Example 2) using the DPB for the electron transporting material at the brightness of 1 kcd/m² was 4.2 V, which was smaller than the voltage of 5.8 V of the device (Comparative Example 1) using Alq₃.

As a result of the evaluation of the brightness-voltage characteristic carried out 60 days after the irradiation of the ultraviolet ray in Example 2, it was found that the characteristic hardly changed from that immediately after the irradiation of the ultraviolet ray, so that the long-term stability of the patterning by the irradiation of the ultraviolet ray was confirmed.

It was confirmed from the above that the organic EL device using the DPB for the electron transporting material could realize a control of a contrast by the luminous brightness according to the irradiation amount of ultraviolet ray, and therefore, the stable patterning could be performed.

Example 4

Ultraviolet ray in an amount of 15.0 J/cm² was irradiated to the whole surface of the device manufactured in Comparative Example 1 in the same manner as in Example 1, while applying a bias (+7.5 V) between the electrodes of the device, and the brightness reduction was evaluated.

As a result, the ratio of the brightness after the irradiation of the ultraviolet ray to the brightness when the ultraviolet ray was not irradiated was 83%.

Comparative Example 2

Ultraviolet ray was irradiated to the device same as that in Example 4 in the same manner as in Example 4 without applying a bias, and the brightness reduction was evaluated.

As a result, the ratio of the brightness after the irradiation of the ultraviolet ray to the brightness when the ultraviolet ray was not irradiated was 95%.

Example 5

An organic EL device was manufactured in the same manner as in Comparative Example 1 except that the thickness of the α-NPD film for the hole transporting layer was set to 41.5 nm and the thickness of Alq₃ for the electron transporting layer was set to 71 nm.

Ultraviolet ray was irradiated to this organic EL device in the same manner as in Example 4, and the brightness reduction was evaluated.

As a result, the ratio of the brightness after the irradiation of the ultraviolet ray to the brightness when the ultraviolet ray was not irradiated was 92%.

Comparative Example 3

Ultraviolet ray was irradiated to the device same as that in Example 5 in the same manner as in Example 4 without applying a bias, and the brightness reduction was evaluated.

As a result, the ratio of the brightness after the irradiation of the ultraviolet ray to the brightness when the ultraviolet ray was not irradiated was 100%.

As shown in Examples 4 and 5 and Comparative Examples 2 and 3, it was found that, by applying a bias in the irradiation of the ultraviolet ray (Examples 4 and 5), it is possible to accelerate the speed of reducing the brightness even in the device using Alq₃ for the electron transporting layer that did not show the brightness reduction only by the irradiation of the ultraviolet ray (Comparative Examples 2 and 3).

What is claimed is:

1. A patterning method of an organic electroluminescent device having an organic layer, containing an organic luminescent material, between a pair of counter electrodes, wherein at least one of the counter electrodes is a transparent electrode, ultraviolet ray is irradiated to the organic layer from the transparent electrode side of the organic electroluminescent device while applying a bias between the counter electrodes, and the irradiation amount is changed so as to form an emission pattern having a contrast caused by the luminous brightness corresponding to the irradiation amount of the ultraviolet ray.

2. The patterning method of an organic electroluminescent device according to claim 1, wherein the organic layer contains a polynuclear phenanthroline derivative expressed by a general formula (I):

$$Z(Y)_n \qquad (I)$$

[wherein Z is a bivalent or trivalent group selected from the group consisting of a bivalent or trivalent aromatic hydrocarbon group and a bivalent or trivalent heterocyclic group; and Y is a phenanthroline group expressed by

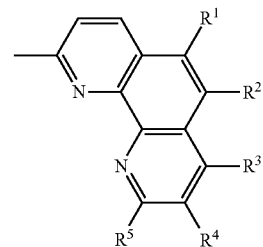

[Chemical 1]

wherein n is 2 or 3, R¹ to R⁵ are groups independently selected from the group consisting of hydrogen, alkyl group, alkoxy group, aryl group (which may be substituted with alkyl group), aryloxy group, aralkyl group (aryl group may be substituted with an alkyl group), alkylamino group, arylamino group, RCOO— (R is selected from the groups constituting an alkyl group, aryl group, and aralkyl group), carboxyl group, amino group, trifluoromethyl group, nitro group, halogen, cyano group, and XA (X is an atom selected from the group consisting of O, S, Se and Te, and A is an alkyl group or aryl group)].

3. The patterning method of an organic electroluminescent device according to claim 2, wherein the polynuclear phenanthroline derivative expressed by the formula (I) is a compound expressed by

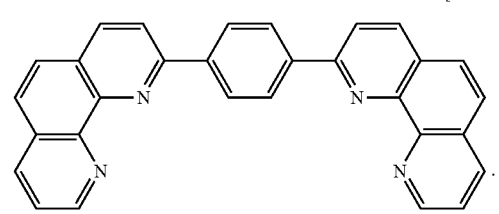

[Chemical 2]

* * * * *